(12) United States Patent
Yoshida et al.

(10) Patent No.: US 6,635,961 B2
(45) Date of Patent: Oct. 21, 2003

(54) ELECTRONIC COMPONENT OF A HIGH FREQUENCY CURRENT SUPPRESSION TYPE AND BONDING WIRE FOR THE SAME

(75) Inventors: Shigeyoshi Yoshida, Abiko (JP); Hiroshi Ono, Yokohama (JP); Koji Kamei, Kawasaki (JP)

(73) Assignee: NEC Tokin Corp., Miyogi (JP)

( * ) Notice: Subject to any disclaimer, the term of this patent is extended or adjusted under 35 U.S.C. 154(b) by 113 days.

(21) Appl. No.: 09/826,436

(22) Filed: Apr. 4, 2001

(65) Prior Publication Data

US 2001/0026016 A1 Oct. 4, 2001

(30) Foreign Application Priority Data

Apr. 4, 2000 (JP) ........................................ 2000-102294
Apr. 5, 2000 (JP) ........................................ 2000-103025

(51) Int. Cl.[7] ......................... H01L 23/34; H01L 23/48; H01L 23/52; H01L 29/40
(52) U.S. Cl. ...................................... 257/728; 257/734
(58) Field of Search ........................ 257/728, 734–738, 257/784–796; 438/124–127

(56) References Cited

U.S. PATENT DOCUMENTS

| | | | |
|---|---|---|---|
| 4,079,192 A | * 3/1978 | Josse | .................... 174/126.2 |
| 4,172,171 A | 10/1979 | Suzuki | |
| 4,760,355 A | 7/1988 | Dash | |
| 5,338,646 A | * 8/1994 | Nakayama et al. | .... 430/270.11 |
| 5,529,831 A | 6/1996 | Waga | |
| 5,538,802 A | * 7/1996 | Kitaori et al. | ........... 428/694 T |
| 5,847,951 A | * 12/1998 | Brown et al. | ................ 363/147 |

FOREIGN PATENT DOCUMENTS

EP 0 854 669 A1 7/1998

* cited by examiner

Primary Examiner—Cuong Quang Nguyen
(74) Attorney, Agent, or Firm—Bradley N Ruben, PC

(57) ABSTRACT

In order to provide an electronic component of a high frequency current suppression type, which can completely suppress a high frequency current to prevent an electromagnetic interference from occurring even when it is used at a high frequency, and a bonding wire for the same, the semiconductor integrated circuit device (IC) (17) operates at a high speed in using at a high frequency band, and a predetermined number of terminals (19) are provided with a high frequency current suppressor (21) for attenuating a high frequency current passing through the terminals themselves. This high frequency current suppressor (21) is a thin film magnetic substance having a range from 0.3 to 20 ($\mu$m) in thickness, and is disposed on the entire surface of each terminal (19), covering a mounting portion to be mounted on a printed wiring circuit board (23) for mounting IC (17) and an edge including a connecting portion to a conductive pattern (25) disposed on the printed wiring circuit board (23). When the top end is connected with the conductive pattern (25) by means of a solder (27) in mounting the printed wiring circuit board (23) of IC (17), the vicinity of the mounting portion has conductivity in a using frequency band, which is less than a few tens MHz.

23 Claims, 9 Drawing Sheets

ELECTRONIC COMPONENT OF A HIGH FREQUENCY CURRENT SUPPRESSION TYPE AND BONDING WIRE FOR THE SAME

BACKGROUND OF THE INVENTION (1) Field of the Invention

The present invention relates to an electronic component for circuit board mounting, which has a predetermined number of terminals mainly represented by a semiconductor active device, such as a semiconductor integrated circuit device (IC), a semiconductor large-scale integrated circuit device (LSI), and a logic circuit device of a high-speed operation type, more particularly, an electronic component of a high frequency current suppression type, comprising a function for attenuating a high frequency current passing through the terminal when the electronic component is used.

The invention also relates to a bonding wire mainly provided for connection between predetermined places of an electric/electronic equipment, more particularly, a bonding wire of a high frequency current suppression type for an electronic component having a function for attenuating a high frequency current passing through the bonding wire itself from an electronic component such as a semiconductor active device used at a high frequency in a bandwidth from a few tens MHz to a few GHz for the purpose of performing a high-speed operation.

(2) Description of the Related Art

Recently, various types of semiconductor active devices, which include a semiconductor storing apparatus represented by a random access memory (RAM) and a read only memory (ROM), for example, or a logic circuit device represented by a microprocessor (MPU), a central processing unit (CPU), an image processor arithmetic logic unit (IPALU) and such is used as an electronic component to be mounted on a printed wiring circuit board, which is mounted on an electronic equipment and/or an information processing apparatus in an electronic information communication field, and which is provided with a conductive pattern.

These semiconductor active devices are provided with a predetermined number of terminals (usually, referred to as a lead frame), which generally are largely integrated in accordance with a circuit layout for the purpose of performing a high-speed operation in using at a high frequency upon manufacturing a product so as to be provided for processing a signal, and are arranged as a chip for a semiconductor integrated circuit device (IC) or a semiconductor large-scale integrated circuit device (LSI).

On the other hand, in relation to such semiconductor active devices, a calculation speed and a signal processing speed are rapidly made higher, and the semiconductor active devices are used at a high frequency in a bandwidth from a few tens MHz to a few GHz under a standard so as to be further highly integrated to perform a high-speed operation.

When the electronic component represented by the semiconductor active devices described above is used at a high frequency in a bandwidth from a few tens MHz to a few GHz for the purpose of performing a high-speed operation, an electric signal passing through a terminal would be a high frequency (high harmonic) current, so that the high frequency current may sometimes transmit between components, between signal paths including terminals, or between equipments/apparatuses on which the electronic component is mounted. Such high frequency current would give a bad influence on an operation process in a component (circuit device) to perform an error operation or would deteriorate a basic function, which are a cause of an electromagnetic interference, and therefore, should be deleted. In the current situation, however, a countermeasure against the high frequency current is not enough taken into account for the electronic component. This leads to a problem that the electromagnetic interference caused by the high frequency current cannot be prevented from occurring.

In the above-mentioned semiconductor chip, a bonding wire connects the predetermined number of terminals and a main body.

In relation to a semiconductor active device, to which connection by a bonding wire for an electronic component is applied, a calculation speed and a signal processing speed are rapidly made higher, and the semiconductor active device is used at a high frequency in a bandwidth from a few tens MHz to a few GHz under a standard so as to be further highly integrated to perform a high-speed operation.

In the case of a bonding wire for an electronic component, however, when the element component is used at a high frequency in a bandwidth from a few tens MHz to a few GHz for the purpose of performing a high-speed operation on the semiconductor active element side, a high frequency (high harmonic) current would pass through a terminal and a wire, so that the high frequency current may transmit between components, between signal paths including terminals, or between equipments/apparatuses on which the electronic component is mounted. Such high frequency current would give a bad influence on an operation process in a component or a circuit device to perform an error operation or would deteriorate a basic function, which are a cause of an electromagnetic interference, and therefore, should be deleted. In the current situation, however, a countermeasure against the high frequency current is not enough taken into account for the electronic component and the bonding wire. This leads to a problem that the electromagnetic interference cannot be prevented from occurring which is caused by the high frequency current.

SUMMARY OF THE INVENTION

It is an object of the invention to provide an electronic component of a high frequency current suppression type, which completely suppresses a high frequency current even when it is used at a high frequency in a bandwidth from a few tens MHz to a few GHz so as to prevent an electromagnetic interference from occurring.

It is another object of the invention to provide a bonding wire of a high frequency current suppression type for an electronic component, which completely suppresses a high frequency current even when it is used at a high frequency in a bandwidth from a few tens MHz to a few GHz so as to prevent an electromagnetic interference from occurring.

According to an aspect of the invention, there is provided an electronic component of a high frequency current suppression type, which comprises a predetermined number of terminals provided for processing a signal. In the electronic component, a part or all of the predetermined number of terminals are provided with a high frequency current suppressor for attenuating a high frequency current passing through the terminals themselves in a bandwidth from a few tens MHz to a few GHz.

It is preferable that, in this electronic component of a high frequency current suppression type, the high frequency current suppressor is disposed on a part or all of the surface of the predetermined terminals at a place other than a mounting portion to be mounted on a circuit board for mounting at least an electronic component and an edge including a connecting portion to a conductive pattern disposed on the circuit board, and that the high frequency current suppressor also has conductivity in a using frequency bandwidth less than a few tens MHz near the mounting portion to be mounted on a circuit board for mounting at least an electronic component.

It is preferable that, in one of the above electronic components of a high frequency current suppression type in an embodiment according to the invention, the high frequency current suppressor is an electronic component of a high frequency current suppression type, which is formed to be a film on a part or all of a surface of the predetermined number of terminals by a sputtering method, or the high frequency current suppressor is formed to be a film on a part or all of a surface of the predetermined number of terminals by a vapor deposition method.

It is also preferable respectively that, in one of the above electronic components of a high frequency current suppression type in an embodiment according to the invention, the high frequency current suppressor comprises a film formed on a part or all of a metallic parent material board used in advance in a manufacturing process of the predetermined number of terminals, and that the high frequency current suppressor comprises a film formed on a part or all of a surface of what is formed as the predetermined number of terminals by cutting out a metallic parent material board used in a manufacturing process of making the predetermined number of terminals.

On the other hand, in the aspect of the invention, it is preferable that, the electronic component of a high frequency current suppression type comprises a predetermined number of terminals provided for processing a signal. In the electronic component, a part or all of the predetermined number of terminals has conductivity in a using frequency bandwidth less than a few tens MHz, and comprises a high frequency current suppressor for attenuating a high frequency current passing through the terminals themselves in a bandwidth from a few tens MHz to a few GHz.

It is respectively preferable that, in this electronic component of a high frequency current suppression type, the high frequency current suppressor is formed by a sputtering method, and that the high frequency current suppressor is formed by a vapor deposition method.

It is preferable that, in one of these electronic components of a high frequency current suppression type, the high frequency current suppressor is in a range from 0.3 to 20 ($\mu$m) in thickness or is a thin film magnetic substance.

On the other hand, it is preferable that, in one of these electronic components of a high frequency current suppression type in the aspect of the invention, the high frequency current suppressor is a magnetic loss material in an M-X—Y system, which is made of a compound of composition elements M, Y, and X, wherein, M denotes at lease one of Fe, Co and Ni, Y denotes at least one of F, N and O, and X denotes at least one of elements other than that of included in M and Y, and is made of a narrow bandwidth magnetic loss material such that the maximum value $\mu''_{max}$ of an imaginary part $\mu''$ exists in a frequency range of 100 MHz to 10 GHz in complex permeability characteristics and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

It is respectively preferable that, in this electronic component of a high frequency current suppression type, a saturation magnetization of the narrow band magnetic loss material is in a range from 80 to 60 (%) of that of a metallic magnetic substance comprising the composition element M alone, and that the narrow band magnetic loss material has a direct current resistivity also in a range from 100 to 700 ($\mu\Omega$·cm).

In addition, it is preferable that, in one of the above electronic components of a high frequency current suppression type in the aspect of the invention, the high frequency current suppressor is a magnetic loss material in an M-X—Y system, which is made of a compound of composition elements M, Y, and X, wherein M denotes at lease one of Fe, Co and Ni, Y denotes at least one of F, N and O, and X denotes at least one of elements other than that of included in M and Y, and is made of a broad bandwidth magnetic loss material such that the maximum value $\mu''_{max}$ of an imaginary part $\mu''$ exists in a frequency range of 100 MHz to 10 GHz in complex permeability characteristics and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

It is respectively preferable that, in this electronic component of a high frequency current suppression type, a saturation magnetization of the broad bandwidth magnetic loss material is in a range from 60 to 35 (%) of that of a metallic magnetic substance comprising the composition element M alone, and that the broad bandwidth magnetic loss material has a direct current resistivity more than 500 ($\mu\Omega$·cm).

In addition, in one of these electronic components of a high frequency current suppression type in the aspect of the invention, the narrow bandwidth magnetic loss material or the above broad bandwidth magnetic loss material has the composition element X, which is at least one of C, B, Si, Al, Mg, Ti, Zn, Hf, Sr, Nb, Ta and rare earth elements, or the narrow bandwidth magnetic loss material or the above broad bandwidth magnetic loss material has the composition element M, which exists in the form of granularity distributed in a matrix of a compound of the composition element X and the composition element Y. In the latter electronic component of a high frequency current suppression type, it is more preferable that the narrow bandwidth magnetic loss material or the above broad bandwidth magnetic loss material has an average diameter of a granular particle in a range from 1 to 40 (nm).

In one of these electronic components of a high frequency current suppression type in the aspect of the invention, it is preferable that the narrow bandwidth magnetic loss material or the broad bandwidth magnetic loss material has an anisotropy magnetic field of 47400 A/m or less.

Moreover, it is preferable that, in one of these electronic components of a high frequency current suppression type in the aspect of the invention, the M-X—Y system is an Fe—Al—O system, or the M-X—Y system is an Fe—Si—O system.

In addition, it is preferable that, in one of these electronic components of a high frequency current suppression type in the aspect of the invention, the electronic component is a semiconductor active device operating at a high speed in using at a high frequency band, and is one of a semiconductor integrated circuit device, a semiconductor large-scale integrated circuit device, and a logic circuit device.

According to another aspect of the invention, there is provided a bonding wire of a high frequency current suppression type for an electronic component which comprises a conductor for connecting electronic components or predetermined places. In the bonding wire, a high frequency current suppressor for attenuating a high frequency current, which passes through the above conductor itself in a bandwidth from a few tens MHz and a few GHz, is formed on at least a part of a surface of the conductor.

In this bonding wire of a high frequency current suppression type for an electronic component, it is preferable that the high frequency current suppressor is disposed so that at least a connecting portion at the both ends of the conductor would be exposed. Further, in this bonding wire of a high frequency current suppression type for an electronic component, it is preferable that the high frequency current suppressor is formed in a lattice shape and also in a manner such that a connecting portion at the both ends of the conductor would be exposed, or that the high frequency current suppressor is disposed in a spiral shape and also in a manner such that a connecting portion at the both ends of the conductor would be exposed.

In one of these bonding wires of a high frequency current suppression type for an electronic component in the aspect of the invention, it is preferable that the high frequency current suppressor is formed on a surface of the conductor by a sputtering method, or that the high frequency current suppressor is formed on a surface of the conductor by a vapor deposition method.

In one of these bonding wires of a high frequency current suppression type for an electronic component in the aspect of the invention, it is preferable that the high frequency current suppressor is formed on a surface of the conductor in advance in a manufacturing process of making the conductor.

In addition, in one of these bonding wires of a high frequency current suppression type for an electronic component in the aspect of the invention, it is preferable that the electronic component has a bare chip to be built in, which comprises a predetermined number of inner connection terminal provided in a main body for processing a signal, and is further provided for respectively connecting the predetermined number of inner connection terminals with a predetermined number of outer connection terminal separately provided in the main body for transmitting a signal.

It is preferable that, in one of these bonding wires of a high frequency current suppression type for an electronic component, the high frequency current suppressor is in a range from 0.3 to 20 ($\mu$m) in thickness, and is a thin film magnetic substance.

On the other hand, in one of these bonding wires of a high frequency current suppression type for an electronic component in another embodiment according to the invention, it is preferable that the high frequency current suppressor is a magnetic loss material in an M-X—Y system, which is made of a compound of composition elements M, Y, and X, wherein M denotes at lease one of Fe, Co and Ni, Y denotes at least one of F, N and O, and X denotes at least one of elements other than that of included in M and Y, and is made of a narrow bandwidth magnetic loss material such that the maximum value $\mu''_{max}$ of an imaginary part $\mu''$ exists in a frequency range of 100 MHz to 10 GHz in complex permeability characteristics and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

In this bonding wire of a high frequency current suppression type for an electronic component, it is respectively preferable that a saturation magnetization of the narrow band magnetic loss material is in a range from 80 to 60 (%) of that of a metallic magnetic substance comprising the composition element M alone, and further that the narrow band magnetic loss material has a direct current resistivity in a range from 100 to 700 ($\mu\Omega$·cm).

On the other hand, in one of these bonding wires of a high frequency current suppression type for an electronic component in the aspect of the invention, it is preferable that the high frequency current suppressor is a magnetic loss material in an M-X—Y system, which is made of a compound of composition elements M, Y, and X, wherein M denotes at lease one of Fe, Co and Ni, Y denotes at least one of F, N and O, and X denotes at least one of elements other than that of included in M and Y, and is made of a broad bandwidth magnetic loss material such that the maximum value $\mu''_{max}$ of an imaginary part $\mu''$ exists in a frequency range of 100 MHz to 10 GHz in complex permeability characteristics and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

In this bonding wire of a high frequency current suppression type for an electronic component, it is respectively preferable that a saturation magnetization of the broad bandwidth magnetic loss material is in a range from 60 to 35 (%) of that of a metallic magnetic substance comprising the composition element M alone, and further that the broad bandwidth magnetic loss material has a direct current resistivity more than 500 ($\mu\Omega$·cm).

In addition, in one of these bonding wires of a high frequency current suppression type for an electronic component in the aspect of the invention, the narrow bandwidth magnetic loss material or the above broad bandwidth magnetic loss material has the composition element X, which is at least one of C, B, Si, Al, Mg, Ti, Zn, Hf, Sr, Nb, Ta and rare earth elements, or the narrow bandwidth magnetic loss material or the above broad bandwidth magnetic loss material has the composition element M, which exists in the form of granularity distributed in a matrix of a compound of the composition element X and the composition element Y In the latter electronic component of a high frequency current suppression type, it is more preferable that the narrow bandwidth magnetic loss material or the broad bandwidth magnetic loss material has an average particle diameter of a particle, which exists in the form of granularity, in a range from 1 to 40 (nm).

In one of these electronic components of a high frequency current suppression type in the aspect of the invention, it is preferable that the narrow bandwidth magnetic loss material or the above broad bandwidth magnetic loss material has an anisotropy magnetic field of 47400 A/m or less.

Moreover, it is preferable that, in one of these electronic components of a high frequency current suppression type in the aspect of the invention, the M-X—Y system is an Fe—Al—O system, or the M-X—Y system is an Fe—Si—O system.

In addition, it is preferable that, in one of these electronic components of a high frequency current suppression type in the aspect of the invention, the electronic component is a semiconductor active device operating at a high speed in using at a high frequency band, and is one of a semiconductor integrated circuit device, a semiconductor large-scale integrated circuit device, and a logic circuit device.

DESCRIPTION OF THE PREFERRED EMBODIMENT

An electronic component of a high frequency current suppression type of the invention will be now described in detail with embodiments, referring to drawings.

Figure 1A:
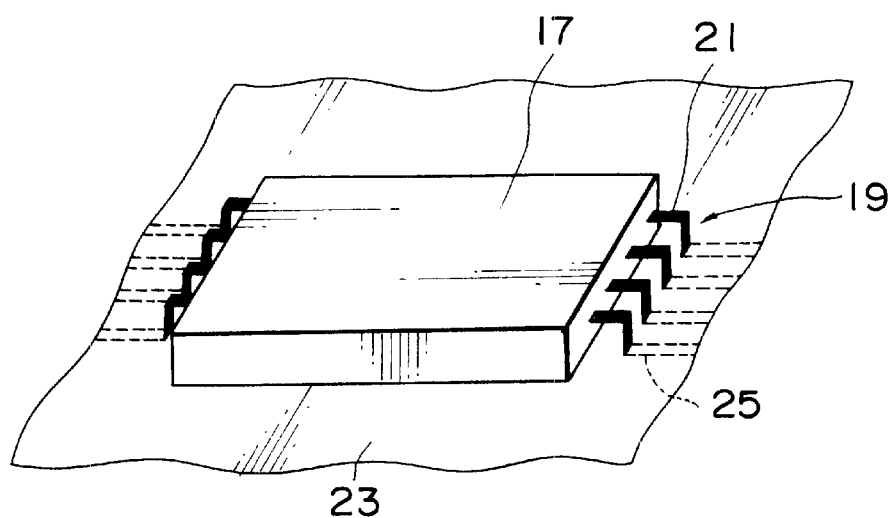
FIG. 1A is a perspective view of a basic structure of a semiconductor integrated circuit device mounted on a printed wiring circuit board in an embodiment of an electronic element of a high frequency current suppression type according to the invention.
Figure 1B:
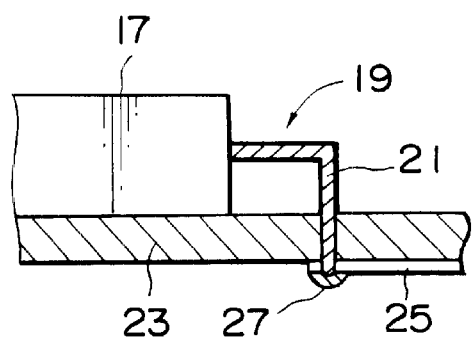
FIG. 1B is a side view of a partially enlarged section of an indispensable part of a conductive integrated circuit device shown in FIG. 1A.

Referring to FIGS. 1A and 1B, a semiconductor integrated circuit device 17 in the first embodiment of the invention is used in a high frequency band to operate at a high speed. A predetermined number of terminals 19 provided for processing a signal are respectively provided with a high frequency current suppressor 21 for attenuating a high frequency current passing through the terminals themselves in a bandwidth from a few tens MHz to a few GHz. This high frequency current suppressor 21 is a thin film magnetic substance having a range from 0.3 to 20 ($\mu$m) in thickness, and is provided on the entire surface of each terminal 19 covering a mounting portion to be mounted on a printed wiring circuit board 23 for mounting the semiconductor integrated circuit device 17 and an edge including a connecting portion with a conductive pattern 25 disposed on the printed wiring circuit board 23. When the top end of each terminal 19 is connected with the conductive pattern 25 disposed on a surface opposite to the mounting surface of the printed wiring circuit board 23 by means of a solder 6 in mounting the semiconductor integrated circuit device 17 on the printed wiring circuit board 23, the vicinity of the mounting portion has conductivity in a using frequency band, which is less than a few tens MHz.

Such semiconductor integrated circuit device 17 is arranged to be provided on a surface of each terminal 19 with the high frequency current suppressor 21, which has conductivity in a using frequency band less than a few tens MHz, and which attenuates a high frequency current passing through each terminal 19 in the bandwidth from a few tens MHz to a few GHz. Thus, even in the case of using the semiconductor integrated circuit device 17 at a high frequency in the bandwidth from a few tens MHz to a few GHz, the high frequency current suppressor 21 sufficiently attenuates the high frequency current passing through each terminal 19, so that an electromagnetic interference can be prevented from occurring and its bad influence can be deleted.

Figure 2A:
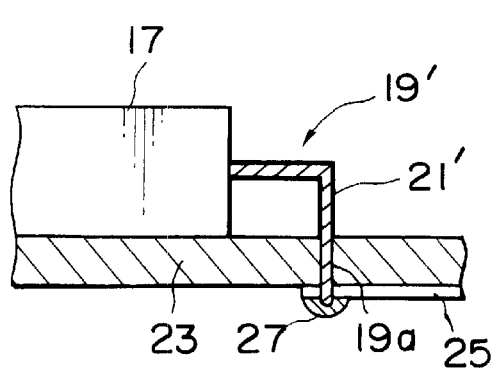
FIG. 2A is a partially enlarged sectional view of an indispensable part of a basic structure of a semiconductor integrated circuit device mounted on a printed wiring circuit board in another embodiment of an electronic element of a high frequency current suppression type according to the invention, in which a high frequency current suppressor provided to a terminal of the semiconductor integrated circuit device has been changed in form.
Figure 2B:
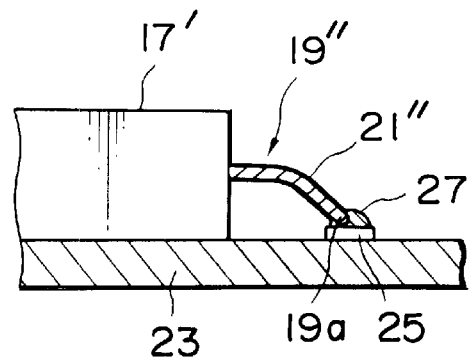
FIG. 2B shows the semiconductor integrated circuit device shown in FIG. 2A, in which the terminal itself has been changed in form.

A form of the high frequency current suppressor 21 provided on the predetermined number of terminals 19 and that of the predetermined number of terminals 19 themselves in the semiconductor integrated circuit device 17 can be changed so that a different arrangement would be achieved like the semiconductor integrated circuit devices 17 and 17' in other embodiments shown in FIGS. 2A and 2B, for example.

That is, referring to FIG. 2A, a basic structure of the semiconductor integrated circuit devices 17 is same as that of the first embodiment, while there is a difference compared with the first embodiment in that the high frequency current suppressor 21' provided on respective surfaces of the predetermined number of terminals 19' is disposed at a place other than a mounting portion to be mounted on the printed wiring circuit board 23 and an edge including a connecting portion with the conductive pattern 25 disposed on the printed wiring circuit board 23, and that a terminal exposed portion 19a, which is exposed due to the above disposition, is arranged to be connected with the conductive pattern 25 disposed on a surface opposite to the mounting portion of the printed wiring circuit board 23 by means of a solder 27.

Referring to FIG. 2B, the semiconductor integrated circuit devices 17' is different from that of the first embodiment and that of FIG. 2A in that a predetermined number of terminals 19" is connected with the conductive pattern 25 disposed on the mounting surface side of the printed wiring circuit board 23. As for other structure, a high frequency current suppressor 21" provided on respective surfaces of the predetermined number of terminals 19" is disposed as same as the case of the predetermined number of terminals 19' shown in FIG. 2A at a place other than a mounting portion to be mounted on the printed wiring circuit board 23 and an edge including a connecting portion with the conductive pattern 25 disposed on the printed wiring circuit board 23, and a terminal exposed portion 19a, which is exposed due to the above disposition, is arranged to be connected with the conductive pattern 25 disposed on the mounting surface side of the printed wiring circuit board 23 by means of a solder 27.

Such semiconductor integrated circuit devices 17 and 17' are also arranged to be provided on the surfaces of respective terminals 19' and 19" with the high frequency current suppressors 21' and 21", which have the conductivity in a using frequency band less than a few tens MHz and which attenuate a high frequency current passing through the respective terminals 19' and 19" in the bandwidth from a few tens MHz to a few GHz. Thus, even in the case of using the semiconductor integrated circuit devices 17 and 17' at a high frequency in the bandwidth from a few tens MHz to a few GHz, the high frequency current suppressors 21' and 21" sufficiently attenuate the high frequency current passing through respective terminals 19' and 19", so that an electromagnetic interference can be prevented from occurring and its bad influence can be deleted.

In any case, the high frequency current suppressors 21, 21' and 21" have a range from 0.3 to 20 ($\mu$m) in thickness and are formed into one body on the terminals 19, 19' and 19" by a sputtering method or a vapor deposition method as a thin film magnetic substance having conductivity in its entire in the using frequency band less than a few tens MHz.

For forming the high frequency current suppressors 21, 21' and 21" on a surface of the predetermined number of terminals 19, 19' and 19", the high frequency current suppressors 21, 21' and 21" may be formed in advance on a metallic parent material board used in a manufacturing process of the predetermined number of terminals 19, 19' and 19" before cutting out the metallic parent material board, otherwise, the high frequency current suppressors 21, 21' and 21" may be formed into a film on a surface of what is formed as the predetermined number of terminals 19, 19' and 19" after cutting out the metallic parent material board. The high frequency current suppressor 21' shown in FIG. 2A and the high frequency current suppressor 21" shown in FIG. 2B can be formed by a sputtering method or a vapor deposition method by using as a mask the mounting portion and the connecting portion between a main body of the semiconductor integrated circuit devices 17 and 17' and the terminals 19' and 19" after mounting the semiconductor integrated circuit devices 17 and 17' on the printed wiring circuit board 23. In any case, the high frequency current suppressors 21, 21' and 21" can be also formed on a part of the surface of the terminals 19, 19' and 19" not only on the entire surface of the terminals 19, 19' and 19", and it is possible to adopt a chemical vapor deposition (CVD) method, an ion beam deposition method, a gas deposition method and a transferring method, other than the above-mentioned sputtering method and the vapor deposition method.

One of materials applicable as the high frequency current suppressors 21, 21' and 21" is a magnetic loss material in an M-X—Y system, which is made of a compound of composition elements M, Y, and X, wherein M denotes at lease one of Fe, Co and Ni, Y denotes at least one of F, N and O, and X denotes at least one of elements other than that of included in M and Y, and is made of a narrow bandwidth magnetic loss material such that the maximum value $\mu''_{max}$ of an imaginary part $\mu''$ (also referred to as a magnetic loss term) exists in a frequency range of 100 MHz to 10 GHz in complex permeability characteristics and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. The narrow band magnetic loss material in this case, however, should have a range of a saturation magnetization from 80 to 60 (%) of that of a metallic magnetic substance comprising a component M alone, and have a direct current resistivity in a range from 100 to 700 ($\mu\Omega$·cm).

Another material applicable as the high frequency current suppressors 21, 21' and 21" is a magnetic loss material in an M-X—Y system, which is made of a compound of composition elements M, Y, and X, wherein M denotes at lease one of Fe, Co and Ni, Y denotes at least one of F, N and O, and X denotes at least one of elements other than that of included in M and Y, and is made of a broad bandwidth magnetic loss material such that the maximum value $\mu''_{max}$ of an imaginary part $\mu''$ exists in a frequency range of 100 MHz to 10 GHz in complex permeability characteristics and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. The broad band magnetic loss material in this case, however, should have a range of a saturation magnetization from 60 to 35 (%) of that of a metallic magnetic substance comprising a component M alone, and have more than 500 $\mu\Omega\cdot$cm in direct current resistivity.

Further, either the narrow band magnetic loss material or the broad band magnetic loss material applied as the high frequency current suppressors 21, 21' and 21" has the component X being at least one of C, B, Si, Al, Mg, Ti, Zn, Hf, Sr, Nb, Ta or rare earth elements and the component M existing in the form of granularity distributed in a matrix of the compound of the component X and the component Y, an average particle diameter of a particle, which exists in the form of granularity, is in a range from 1 to 40 (nm), and an anisotropy magnetic field is 47400 A/m or less. In the case of concretely limiting the M—X—Y system of the narrow band magnetic loss material or the broad band magnetic loss material, it is preferable to limit the above to an Fe—Al—O system or an Fe—Si—O system.

Figure 3A:
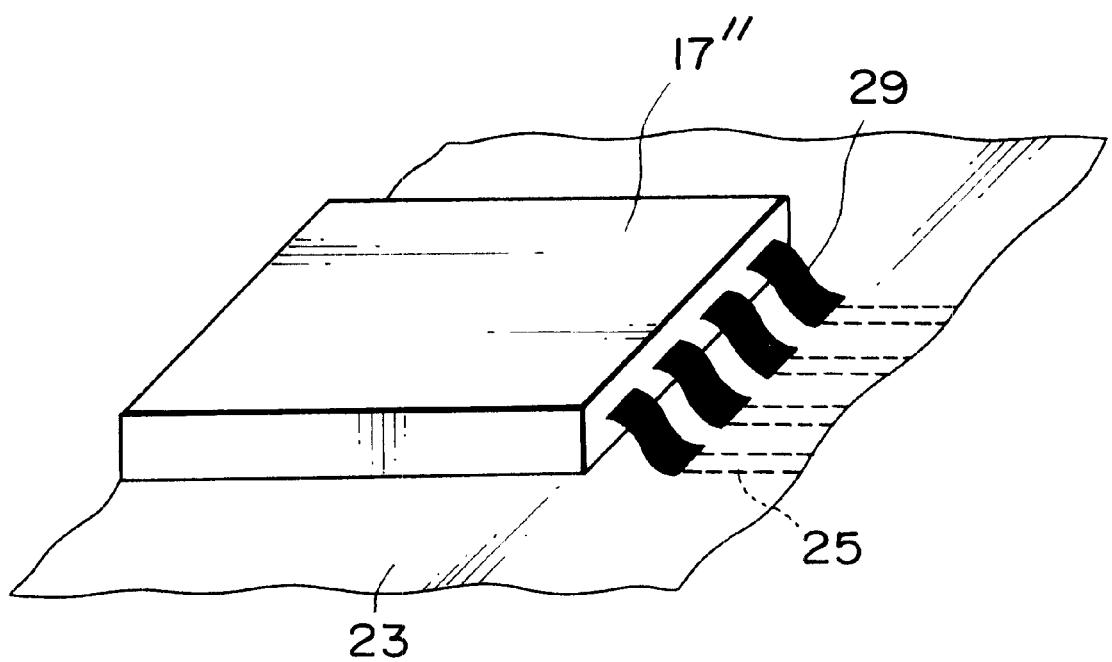
FIG. 3A is a perspective view of a basic structure of a semiconductor integrated circuit device mounted on a printed wiring circuit board in another embodiment of an electronic component of a high frequency current suppression type according to the invention.
Figure 3B:
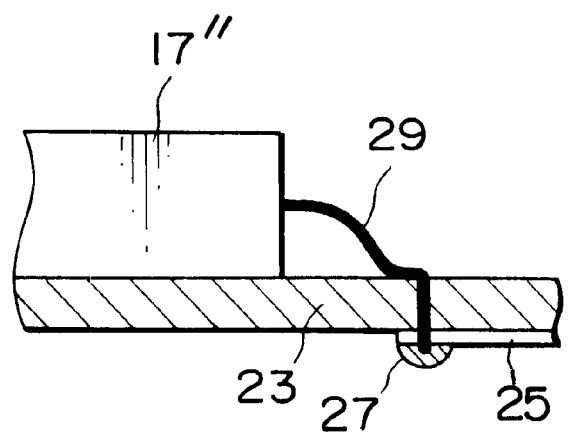
FIG. 3B is a side view of a partially enlarged section of an indispensable part shown in FIG. 3A.

Referring to FIGS. 3A and 3B, a structure of the semiconductor integrated circuit device 17" in the third embodiment according to the invention is different from that of the first and second embodiments described above in that the predetermined number of terminals themselves are made into a high frequency current suppressor 29 in the form of wide sheet, which is made of a high frequency current suppressor, so as to form a lead frame.

A high frequency current suppressor 7 in the form of wide sheet here is also a thin film magnetic substance made of the narrow band magnetic loss material or the broad band magnetic loss material having a composition similar to that of the above-described high frequency current suppressors 21, 21''', and the M—X—Y system of the narrow band magnetic loss material or the broad band magnetic loss material is an Fe—Al—O system or an Fe—Si—O system.

Accordingly, in the case of using this semiconductor integrated circuit device 17" at a high frequency in the bandwidth from a few tens MHz to a few GHz, same as the first and other embodiments, the high frequency current suppressor 29 in the form of wide sheet sufficiently attenuates the high frequency current passing through the suppressor itself, so that an electromagnetic interference can be prevented from occurring and its bad influence can be deleted. It is also possible to change an arrangement of the semiconductor integrated circuit device 17" here so that a top end of the high frequency current suppressor 29 in the form of wide sheet is connected with the conductive pattern 25 disposed on the mounting surface side of the printed wiring circuit board 23 by means of a solder 27.

It is described in each above embodiment that the semiconductor integrated circuit devices 17, 17' and 17" are used as an electronic component. It is effective, however, to apply a semiconductor active device including a logic circuit device represented by a semiconductor large-scale integrated circuit device (LSI), a microprocessor (MPU), a central processing unit (CPU), an image processor arithmetic logic unit (IPALU) or such instead of the above semiconductor integrated circuit devices 17, 17' and 17". Other than that, in the case of an electronic component having a terminal to be used as a lead frame mounted on the printed wiring circuit board 23, an effect in suppressing a high frequency current and in preventing electromagnetic interference occurrence can be achieved when a high frequency current suppressor is disposed on a terminal of the component, or when it is arranged that the terminal itself is made into the high frequency current suppressor 29 in the form of wide sheet.

Anyway, a thin film magnetic substance with a small volume, which is a magnetic loss material having a large imaginary part $\mu''$ (referred to as a magnetic loss term, hereinafter) in complex permeability characteristics and which enables an effective countermeasure against an undesired radiation, is used for the high frequency current suppressors 21, 21' and 21" provided on respective terminals 19, 19' and 19" in the semiconductor integrated circuit devices 17 and 17' in the form described in the first to third embodiments, or for the high frequency current suppressor 29 in the form of a sheet, which instead uses a terminal itself, and which is described in another embodiment.

Next, a bonding wire of a high frequency current suppression type for an electronic component according to the invention will be described in detail with reference to the drawings.

Figure 4A:
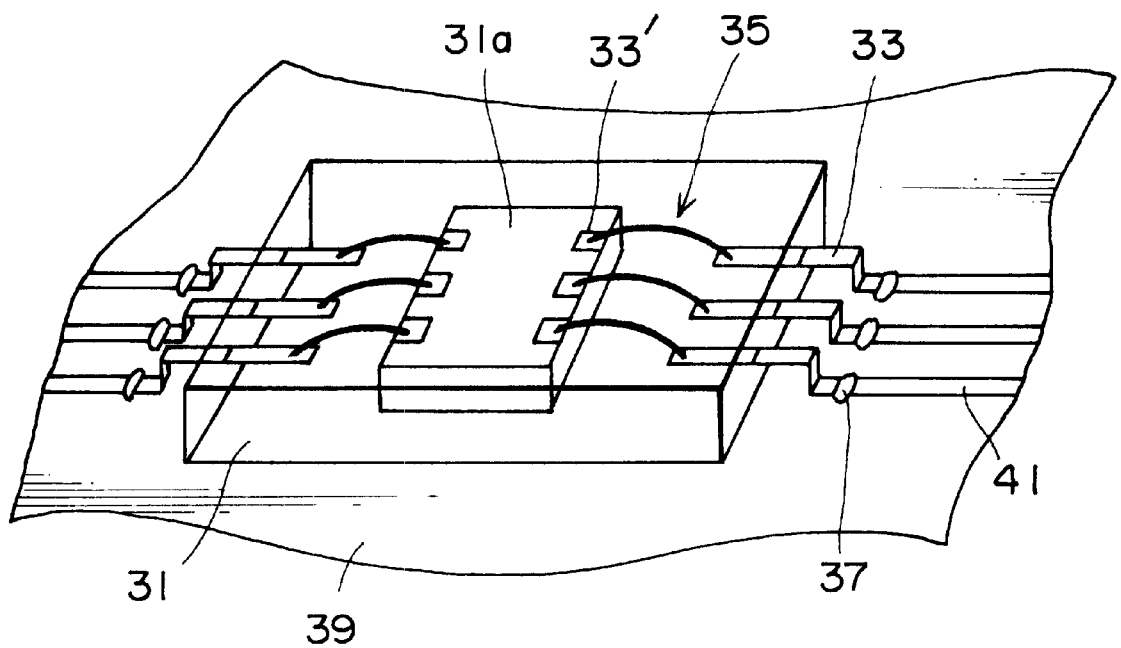
FIG. 4A is a perspective view of an inner part of a basic structure of a semiconductor integrated circuit device including a bonding wire of a high frequency current suppression type and mounted on a printed wiring circuit board in the fourth embodiment according to the invention.
Figure 4B:
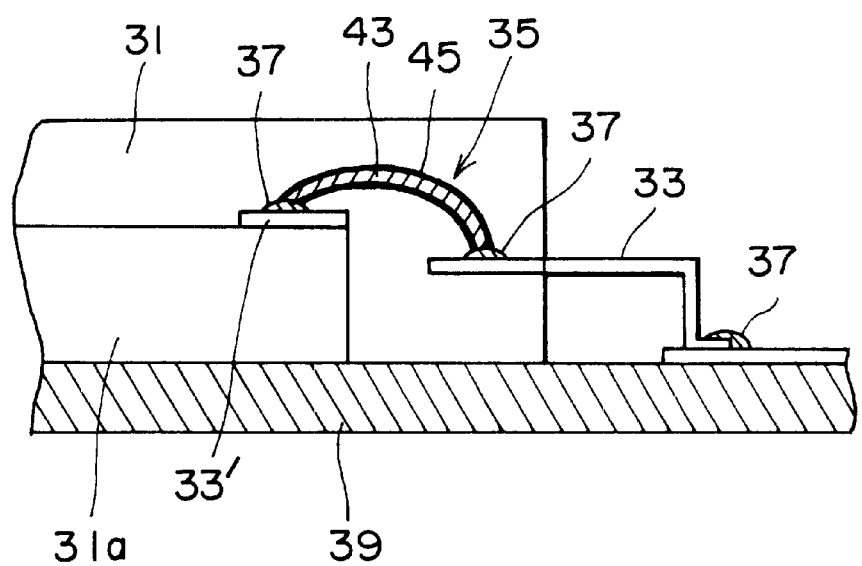
FIG. 4B is a side view of a partially enlarged section of an indispensable part shown in FIG. 4A.

Referring to FIGS. 4A and 4B, a semiconductor integrated circuit device 31 in the fourth embodiment according to the invention is used in a high frequency band to operate at a high speed, and has a bare chip 31a built in, which comprises a predetermined number (here, 6 pieces) of inner connection terminal 33' provided to a main body for processing a signal. The semiconductor integrated circuit device 31 is molded with a molding material so that the bare chip 31a, a bonding wire 35 and a part of each terminal 33 would be covered by a molding body, after connecting and fixing the both ends of each bonding wire 35 of a high frequency current suppression type between each inner connecting terminal 33' and each of a predetermined number (here, 6 pieces as the same) of outside connecting terminals 33 by means of a solder 37. In the semiconductor integrated circuit device 31, the top end of each outside connection terminal 33 is connected to a conductive pattern 41 disposed on a printed wiring circuit board 39 by means of a solder 37 in the mounting on the printed wiring circuit board 39.

The bonding wire 35 here is arranged to be a high frequency current suppression type by disposing on a surface of a conductor 43 a high frequency current suppressor 45 for attenuating a high frequency current passing through the conductor 43 itself in a bandwidth from a few tens MHz to a few GHz. The high frequency current suppressor 45 itself has a range from 0.3 to 20 ($\mu$m) in thickness, is made of a thin film magnetic substance, the entire part of which has conductivity in a using frequency band less than a few tens MHz, and is formed into one body on the conductor 43 by a sputtering method or a vapor deposition method. For forming the high frequency current suppressor 45 on a surface of the conductor 43, the high frequency current suppressor 45 may be formed on a surface of a low resistance core wire 8, which has been manufactured in a process of manufacturing the conductor 43, except a connecting portion at the both ends of the conductor 43. That is, the both ends of the conductor 43 in the bonding wire 35 would be exposed after forming the high frequency current suppressor 45 and forms connecting portions provided for connection by such as spot soldering.

In such semiconductor integrated circuit device 31, it is arranged that the bonding wire 35 itself respectively connecting each inner connecting terminal 33' of the bare chip 31a and each outside connecting terminal 33 separately disposed in a main body is provided on a conductor 43 with the high frequency current suppressor 45 for attenuating a high frequency current passing through the conductor 43 itself in a bandwidth from a few tens MHz to a few GHz. Therefore, the high frequency current suppressor 45 sufficiently attenuates the high frequency current, which passes through each outside connection terminal 33, when the high frequency current is transmitted to the bonding wire 35 in using the semiconductor integrated circuit device 31 at a high frequency in a bandwidth from a few tens MHz to a few GHz, so that the high frequency current can be prevented from being transmitted to each inner connection terminal 33' of the bare chip 31a. As a result, an electromagnetic interference can be prevented from occurring and its bad influence (such as an error operation of the semiconductor integrated circuit device 31) can be deleted.

In the above-described structure, the bonding wire 35 of a high frequency current suppression type is provided with the high frequency current suppressor 45 on the entire surface of the conductor 43 except the connecting portions at the both ends in any case. It is possible, however, to provide the bonding wire in various forms by transforming its arrangement to dispose the high frequency current suppressor 45 so that any local part of the conductor 43 would be exposed. For example, when the high frequency current suppressor 45 is disposed so that the conductor 43 would be exposed in a circle in a predetermined interval in a longitudinal direction of the conductor 43, the high frequency current suppressor 45 itself would be a form of several nodes separated in the predetermined interval.

Figure 5:
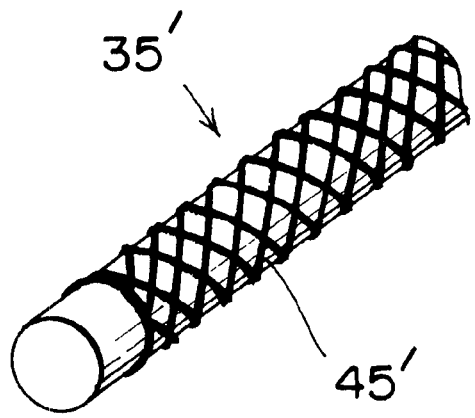
FIG. 5 shows another form of a bonding wire of a high frequency current suppression type shown in FIG. 4, which is partially cut off.
Figure 6:
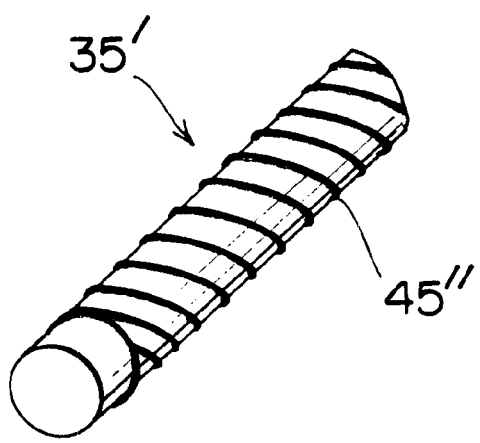
FIG. 6 is a perspective view of another form of a bonding wire of a high frequency current suppression type shown in FIG. 4, which is partially cut off.

It is also possible to form a bonding wire into a lattice shape of high frequency current suppressor 45' such as the bonding wire 35' in another form shown in FIG. 5, or into a spiral shape of high frequency current suppressor 45" such as the bonding wire 35" in another form as shown in FIG. 6. In any case, in order to expose the conductor 43 like the bonding wires 35' and 35", the high frequency current suppressors 45, 45' and 45" can be formed into a film by using the shape of the portion, which would be exposed, as a mask by a sputtering method or a vapor deposition method before deleting the mask portion by etching. Accordingly, the effect in attenuating a high frequency current and in preventing high frequency noise occurrence can be achieved as well as each embodiment described above. For forming the high frequency current suppressors 45, 45' and 45", a chemical vapor deposition (CVD) method, an ion beam deposition method, a gas deposition method and a transferring method can be applied other than the above-mentioned sputtering method and the vapor deposition method.

One of materials applicable as the high frequency current suppressors 45, 45' and 45" is a magnetic loss material in an M-X—Y system, which is made of a compound of composition elements M, Y, and X, wherein M denotes at lease one of Fe, Co and Ni, Y denotes at least one of F, N and O, and X denotes at least one of elements other than that of included in M and Y, and is made of a narrow bandwidth magnetic loss material such that the maximum value $\mu''_{max}$ of an imaginary part $\mu''$ (also referred to as a magnetic loss term) exists in a frequency range of 100 MHz to 10 GHz in complex permeability characteristics and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. The narrow band magnetic loss material in this case, however, should have a range of a saturation magnetization from 80 to 60 (%) of that of a metallic magnetic substance comprising a component M alone, and have a range from 100 to 700 ($\mu\Omega\cdot$cm) in direct current resistivity.

Another material applicable as the high frequency current suppressors 45, 45' and 45" is a magnetic loss material in an M-X—Y system, which is made of a compound of composition elements M (wherein, M denotes at lease one of Fe, Co and Ni), Y (wherein, Y denotes at least one of F, N and O) and X (wherein, X denotes at least one of elements other than that of included in M and Y), and is made of a broad bandwidth magnetic loss material such that the maximum value $\mu''_{max}$ of an imaginary part $\mu''$ exists in a frequency range of 100 MHz to 10 GHz in complex permeability characteristics and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. The broad band magnetic loss material in this case, however, should have a range of a saturation magnetization from 60 to 35 (%) of that of a metallic magnetic substance comprising a component M alone, and have more than 500 $\mu\Omega\cdot$cm in direct current resistivity.

Either the narrow band magnetic loss material or the broad band magnetic loss material applied as the high frequency current suppressors 45, 45' and 45" has the component X being at least one of C, B, Si, Al, Mg, Ti, Zn, Hf, Sr, Nb, Ta or rare earth elements and the component M existing in the form of granularity distributed in a matrix of the compound of the component X and the component Y, an average particle diameter of a particle, which exists in the form of granularity, is in a range from 1 to 40 (nm), and an anisotropy magnetic field is 47400 A/m or less. In the case of concretely limiting the M-X—Y system of the narrow band magnetic loss material or the broad band magnetic loss material, it is preferable to be an Fe—Al—O system or an Fe—Si—O system.

It is described in each above embodiment that the semiconductor integrated circuit devices (ICs) 31 and 31' are used as an electronic component. It is effective, however, to apply a semiconductor active device including a logic circuit device represented by a semiconductor large-scale integrated circuit device (LSI), a microprocessor (MPU), a central processing unit (CPU), an image processor arithmetic logic unit (IPALU) and such instead of the above semiconductor integrated circuit devices 31 and 31'. Other than that, in the case of an electronic component having a terminal to be used as a lead frame mounted on the printed wiring circuit board 39, and the case of an electronic component to be used for connection of the bonding wires 35, 35' and 35" of a high frequency current suppression type, an effect in suppressing a high frequency current and in deleting a high frequency noise can be achieved by using such electronic component.

Anyway, in the above described forms of the semiconductor integrated circuit devices 31, 31', a thin film magnetic substance with a small volume, which is a magnetic loss material having a large imaginary part $\mu''$ (referred to as a magnetic loss term) in complex permeability characteristics and which enables an effective countermeasure against an undesired radiation, is used for the high frequency current suppressor 45 disposed on the bonding wire 35, which connects each predetermined terminal 33 and a predetermined place of the conductive pattern on a main body of the semiconductor integrated circuit device 31 or the printed wiring circuit board 39, or for the high frequency current suppressors 45' and 45" disposed on the bonding wires 35' and 35".

Now, a technical background of research and development of the magnetic loss material used in the invention will be described.

The inventors has ever proposed a composite magnetic substance whose magnetic loss is large in a high frequency band before the application of the invention, and found the way of effectively suppressing undesired radiation, which is caused by an electronic component represented by a semiconductor active device, by disposing the above composite magnetic substance close to a source of the undesired radiation.

It is known from a recent study that the above-described operation of attenuating the undesired radiation, which uses a magnetic loss of the magnetic substance, is achieved by giving an equivalent resistance component to the electronic circuit of an electronic component, which is the source of the undesired radiation. The size of the equivalent resistance component depends on the size of the magnetic loss term $\mu''$ of the magnetic substance. More particularly, the size of the resistance component equivalently inserted to an electronic circuit is generally in proportion to the magnetic loss term $\mu''$ and the thickness of the magnetic substance when the area of the magnetic substance is fixed. Therefore, the larger magnetic loss term $\mu''$ is required to achieve desired attenuation of the undesired radiation in the smaller or thinner magnetic substance. For example, the magnetic loss term $\mu''$ was required to be an extremely large value in order to take measures against the undesired radiation by means of the magnetic loss substance in a minute area such as an inner part of a mold of a semiconductor integrated circuit device, so that the required magnetic substance should have had an extremely large magnetic loss term $\mu''$ compared with the conventional magnetic loss material.

The inventors focused on the excellent permeability characteristics of a granular magnetic substance, which is formed by minute magnetic metallic particles evenly distributed in an un-magnetic substance such as a ceramic, in a process of a study for forming a film of the soft magnetic substance by means of a sputtering method or a vapor deposition method. As a result of a study for microstructure of the magnetic metallic particles and the un-magnetic substance enclosing the particle, they found that great magnetic loss characteristics could be obtained in a high frequency range when the concentration of the magnetic metallic particles in the granular magnetic substance exists within a specific range.

Figure 7:
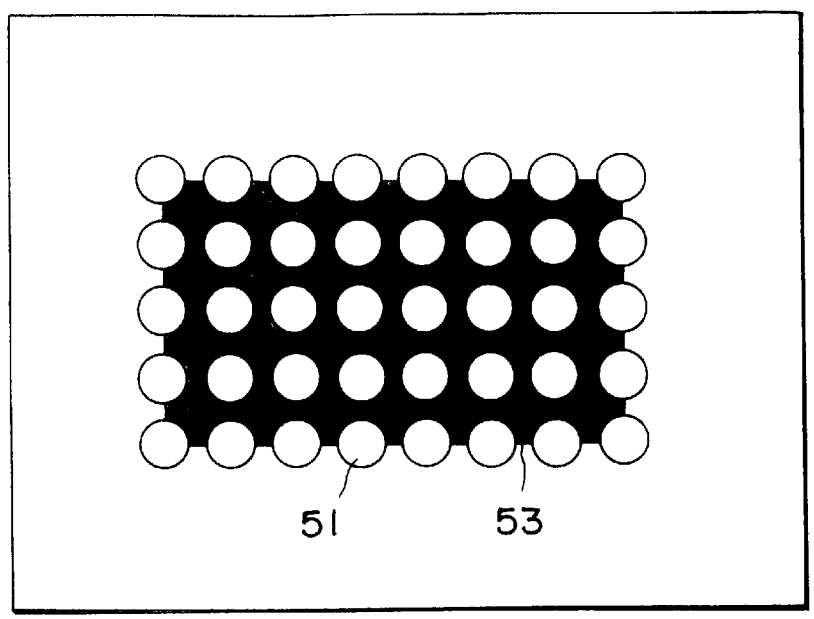
FIG. 7 is a simplified diagram of a basic structure of a granular magnetic substance, which is a high frequency current suppressor material used for a bonding wire shown in FIGS. 4 to 6.

Referring to FIG. 7, a basic structure of a granular magnetic substance in the M-X—Y system is shown simply. There have ever been many studies for the granular magnetic substance having a composition of an M-X—Y system (wherein, the component M denotes at least one of Fe, Co and Ni, the component Y denotes at least one of F, N and O, and X denotes at least one of elements other than elements included in the component M and the component Y), and it has been known that the granular magnetic substance has a large saturation magnetization with a lower loss. In this granular magnetic substance in the M-X—Y system, the size of the saturation magnetization depends on the volume ratio of the component M 51. Thus, the ratio of the component M 51 should be made higher in order to achieve a large saturation magnetization. For this purpose, the rate of the component M 51 in the granular magnetic substance in the M-X—Y system has been limited within a range capable of achieving a saturation magnetization of generally 80% or more of that of the bulk metallic magnetic substance comprising the component M 51 alone, in a general use such that the granular magnetic substance in the M-X—Y system is used as a magnetic core of a high frequency inductor element or a transformer.

As a result of examining in wide range the rate of the component M 51 in the granular magnetic substance in the M-X—Y system, the inventors found that the large magnetic loss was shown in a high frequency range in any case when the concentration of the magnetic metallic was in a certain range.

Generally, the highest range, in which a ratio of the component M 51 indicates a saturation magnetization of 80% or more of that of the bulk metallic magnetic substance comprising the component M 51 alone, is the range, which so far has been studied popularly, of the granular magnetic substance in the M-X—Y system with a higher saturation magnetization and a lower loss. A granular magnetic material existing in this range is used for a high frequency micro magnetic device such as the aforementioned high frequency inductor, since the granular magnetic material has a large value of real part $\mu'$ in the permeability characteristics and that of a saturation magnetization. The resistivity, however, is small since the rate of the components X—Y 12, which influences the resistivity, is low. When the film thickness becomes thick for the above reason, the permeability $\mu$ at the high frequency would deteriorate in accordance with the occurrence of the eddy-current loss in the high frequency range, so that the above-described material is not suitable for a comparatively thick magnetic film used as a noise-countermeasure.

On the other hand, in a range where the ratio of the component M 51 indicates a saturation magnetization of 80% or less and 60% or more of that of the bulk metallic magnetic substance composing the component M 51 alone, the resistivity is comparatively large such that generally 100 $\mu\Omega$·cm or more, so that the eddy-current loss would be little even when the thickness of the magnetic substance material is only a few $\mu$m and that the magnetic loss would be a loss almost caused by natural resonance. Thus, the frequency distribution width of the magnetic loss term $\mu''$ would be narrow, which is suitable for a noise-countermeasure in a range of a frequency in a narrow band (high frequency current suppression). In a range where the ratio of the component M 51 indicates a saturation magnetization of 60% or less and 35% or more of that of the bulk metallic magnetic substance composing the component M 51 alone, the resistivity is further larger such that generally 500 $\mu\Omega$·cm or more, so that the eddy-current loss would be extremely small, and that a little magnetic interaction between components M 51 causes larger thermal agitation of a spin and thereby fluctuation of a frequency at which natural resonance occurs. As a result, the magnetic loss term $\mu''$ would show a larger value in a wide range. Thus, such a suitable composition range is effective for suppression of high frequency current in a broad band. In a range in which the ratio of the component M 51 is further smaller than that of a suitable composition range, magnetic interaction between components M 51 hardly occurs and thereby the range becomes super paramagnetic.

The reference for designing a material in disposing a magnetic loss material adjacent to an electronic circuit so as to suppress a high frequency current is given by a product $\mu''\cdot\delta$ of the magnetic loss term $\mu''$ and a thickness $\delta$ of the magnetic loss material. Generally, $\mu''\cdot\delta \geq 1000$ ($\mu$m) is required for effectively suppressing high frequency current at a few hundreds MHz of frequency. Therefore, the magnetic loss material of $\mu''=1000$ is required to have a thickness of 1 $\mu$m or more. So, a material having a low resistivity in which eddy-current loss occurs easily is not preferable to be used. The abovedescribed suitable composition range having an resistivity of 100 $\mu\Omega$·cm or more (the range that the ratio of the component M 51 indicates a saturation magnetization of 80% or less of that of the bulk metallic magnetic substance comprising the component M 51 alone and that the super paramagnetism would not occur, and the range that the ratio of the component M 51 indicates a saturation magnetization of 35% or more of that of the bulk metallic magnetic substance comprising the component M 51 alone) is suitable.

A process for manufacturing a granular magnetic loss material, which is a material of respective high frequency current suppressors 45, 45' and 45" described above, as several samples under different conditions by a sputtering method will be concretely described hereinafter. In producing each sample, however, a sample producing apparatus of a sputtering method adopting type is used, as shown in FIG. 8A.

Figure 8A:
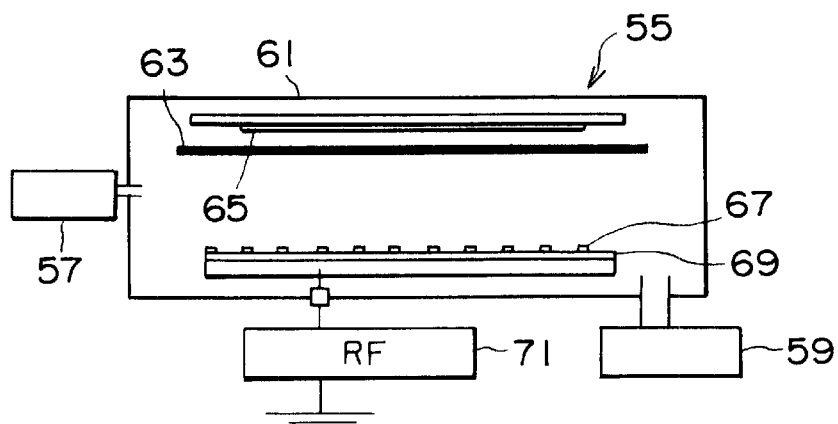
FIG. 8A shows a sample producer of a sputtering method applying type, which has a basic structure of an apparatus used for producing a sample of a granular magnetic substance described with reference to FIG. 7.

Referring to FIG. 8A, this sample producing apparatus of a sputtering method adopting type 55 comprises a vacuum container (chamber) 69, to which a gas supplying apparatus 57 and a vacuum pump 59 are connected and in which a substrate 65 is faced to a target 69 comprising the component M with a shutter 63 disposed between the substrate 65 and the target 69. The target 69 is provided with chips 67, which comprise the composition elements X—Y or the composition element X, in a predetermined interval. A high frequency power source (RF) 71 is connected on a side of a supporting portion of the chips 67 and the target 69.

Sample 1

Here, Ar gas was supplied into the vacuum container 61 from the gas supplying apparatus 57, and the vacuum pump 59 maintained the vacuum degree in the vacuum container 61 to be around $1.33 \times 10^{-4}$ Pa. In such Ar gas atmosphere, total 120 pieces of $Al_2O_3$ chips with the dimensions of 5 mm in height×5 mm in width×2 mm in thickness, which would be chips 67, were disposed on an Fe-made round plate having a diameter $\phi$ of 100 mm, which would be the target 69, and a high frequency power was supplied from the high frequency power source 71. Under this condition, a magnetic thin film was formed on a glass plate, which would be the substrate 65, by a sputtering method, and then, the formed magnetic thin film was heat-treated at a temperature of 300° C. for two hours in vacuum under magnetic field so as to obtain a sample 1 of a granular magnetic thin film described above.

This sample 1 was analyzed by a fluorescent X-ray spectroscopy and confirmed as a film of a composition $Fe_{72}Al_{11}O_{17}$. The sample had 2.0 $\mu$m in film thickness, 530 $\mu\Omega$·cm in direct current resistance, 1422 A/m in anisotropy field $H_k$, 1.68 T (tesla) in a saturation magnetization $M_{S,\,and}$ 148% in relative bandwidth bwr. The relative bandwidth bwr is obtained by extracting a frequency bandwidth between two frequencies at which the value of $\mu"$ is 50% of the maximum $\mu"_{max}$ and normalizing the frequency bandwidth at the center frequency thereof (considered to be same, also hereinafter). A percent ratio of the saturation magnetization $M_S$ (M-X—Y) of the sample 1 and that of the metallic magnetic substance comprising the component M alone $M_S$ (M) $\{M_S\,(M\text{-}X\text{—}Y)/M_S\,(M)\}\times 100\%$ (considered to be same, also hereinafter) was 72.2%.

In order to inspect the magnetic loss characteristics of the sample 1, characteristics of the permeability $\mu$ for a frequency was examined by inserting the sample 1 into a detecting coil, which had been processed into a strip, and measuring impedance with the bias magnetic field impressed. Then, characteristics of the magnetic loss term $\mu"$ (complex permeability characteristics) for a frequency f were obtained on the basis of the result.

Figure 9:
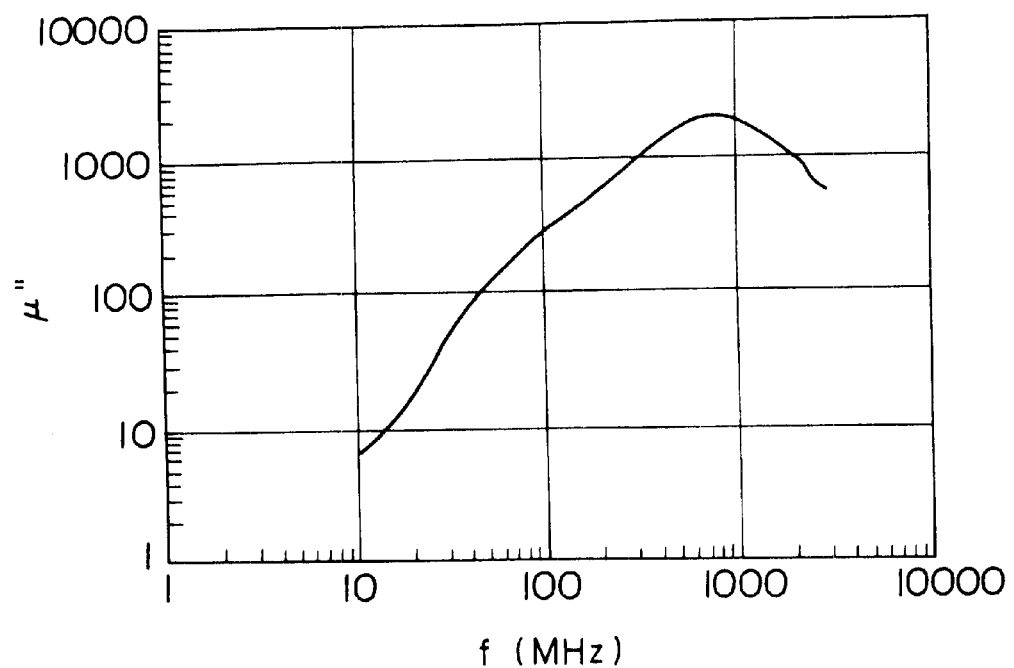
FIG. 9 shows magnetic loss term characteristics (complex permeability) of a sample 1 for a frequency, the sample 1 being produced by means of the sample producer of a sputtering method applying type shown in FIG. 8A.

Referring to FIG. 9, it is noted that the characteristics of the magnetic loss term $\mu"$ (complex permeability characteristics) for the frequency f (MHz) of the sample 1 has a comparatively rapid distribution and an extremely high peak, and that the resonance frequency is also as high as about 700 MHz.

Sample 2

Here, a sample 2 of a granular magnetic thin film was produced in the same condition and manner as that of producing the above-mentioned sample 1 except that the number of the $Al_2O_3$ chips is changed to 150.

This sample 2 was analyzed by a fluorescent X-ray spectroscopy and confirmed as a film of a composition $Fe_{44}Al_{22}O_{34}$. The sample had 1.2 $\mu$m in film thickness, 2400 $\mu\Omega$·cm in direct current resistance, 9480 A/m in anisotropy field $H_k$, 0.96 T in a saturation magnetization $M_S$, 181% in relative bandwidth bwr, and 44.5% in percent ratio $\{M_S$ (M-X—Y)/$M_S$ (M)$\}\times 100\%$.

Figure 10:
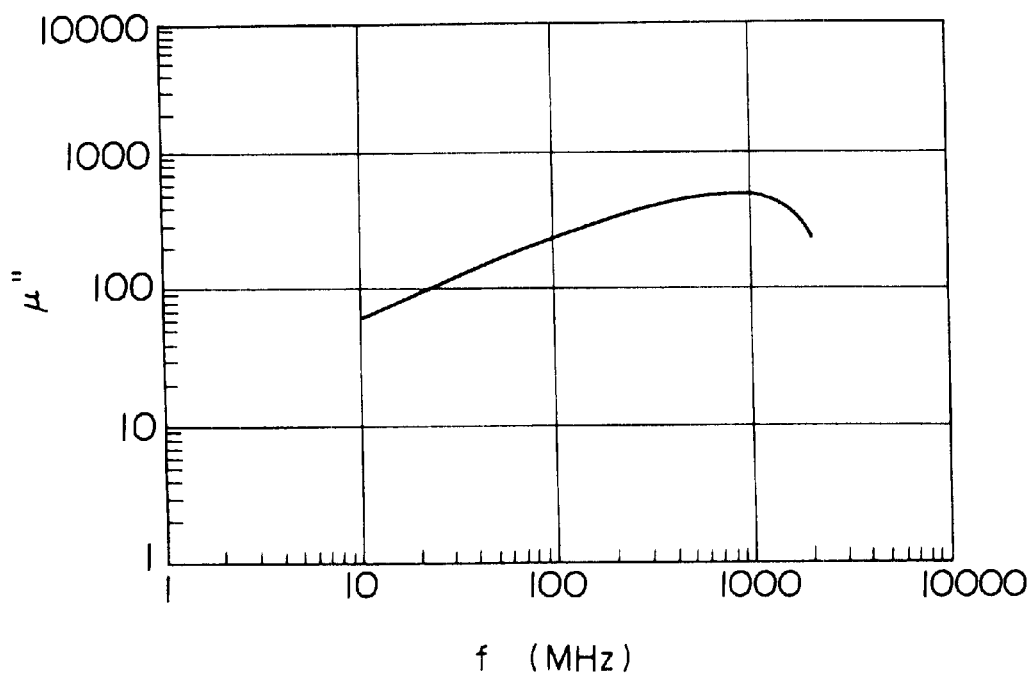
FIG. 10 shows magnetic loss term characteristics (complex permeability) of a sample 2 for a frequency, the sample 2 being produced by means of the sample producer of a sputtering method applying type shown in FIG. 8A.

Referring to FIG. 10, it is noted that the characteristics of the magnetic loss term $\mu"$ (complex permeability characteristics) for the frequency f (MHz) of the sample 2 has a gradual distribution, which extends to a broad band, due to thermal agitation and has a high peak similar to that in the sample 1. The value of direct current resistance, however, is extremely large compared with that in the sample 1 and the resonance frequency at the peak is also about 1 GHz. This shows an excellent high frequency characteristics.

Sample 3

Here, a sample 3, which would be the first comparison sample, of a granular magnetic thin film was produced in the same condition and manner as that of producing the above-mentioned sample 1 except that the number of the $Al_2O_3$ chips is changed to 90.

This sample 3 was analyzed by a fluorescent X-ray spectroscopy and confirmed as a film of a composition $Fe_{86}Al_6O_8$. The sample had 1.2 $\mu$m in film thickness, 74 $\mu\Omega$·cm in direct current resistance, 1738 A/m in anisotropy field $H_k$, 1.88 T in a saturation magnetization $M_S$, and 85.7% in percent ratio $\{M_S$ (M-X—Y)/$M_{S\,(M)}\}\times 100\%$.

Figure 11:
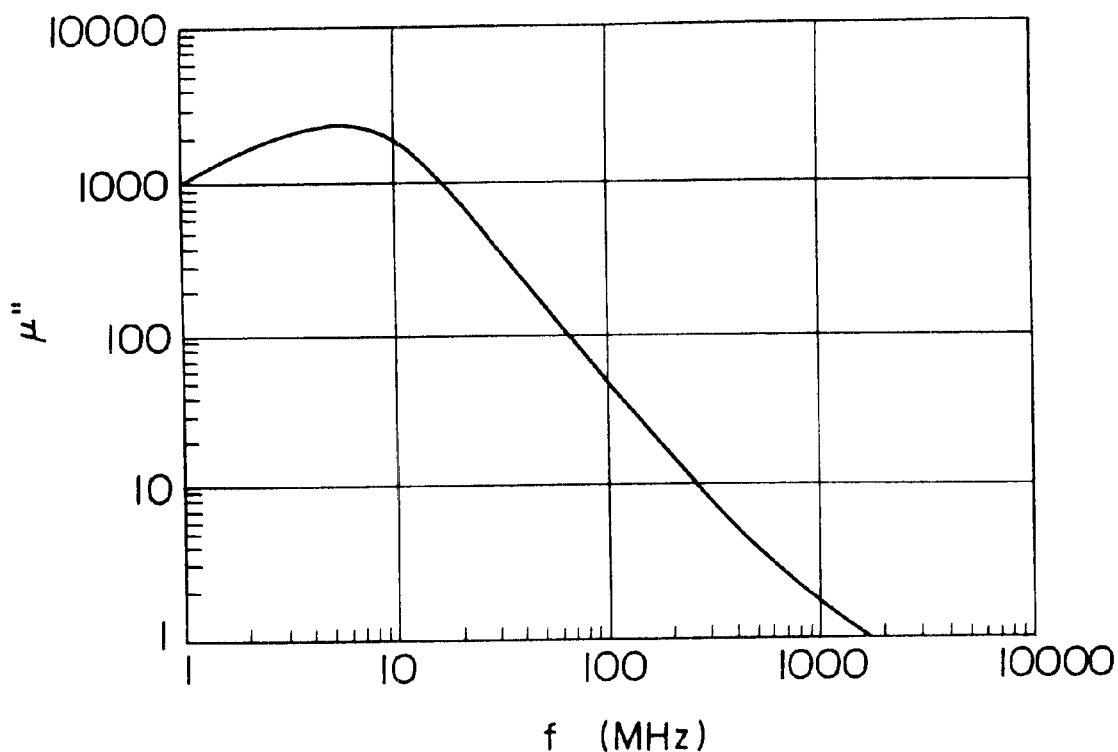
FIG. 11 shows magnetic loss term characteristics (complex permeability) of a sample 3 (the first comparison sample) for a frequency, the sample 3 being produced by means of the sample producer of a sputtering method applying type shown in FIG. 8A.

Referring to FIG. 11, it is noted that the characteristics of the magnetic loss term $\mu"$ (complex permeability characteristics) for the frequency f (MHz) of the sample 3 (the first comparison sample) show a large value at the peak in response to a large saturation magnetization, while eddy-current loss occurs due to a lower resistance as a frequency increases, and thereby the permeability (magnetic loss characteristics) in a lower frequency range appears to deteriorate, so that the characteristics at a high frequency would be worse compared with the samples 1 and 2.

Sample 4

Here, a sample 4, which would be the second comparison sample, of a granular magnetic thin film was produced in the same condition and manner as that of producing the above-mentioned sample 1 except that the number of the $Al_2O_3$ chips is changed to 200.

This sample 4 was analyzed by a fluorescent X-ray spectroscopy and confirmed as a film of a composition $Fe_{19}Al_{34}O_{47}$. The sample had 1.3 $\mu$m in film thickness and 10500 $\mu\Omega$·cm in direct current resistance. The magnetic characteristics of the sample exhibited superparamagnetism.

It was also tried to obtain the characteristics of the magnetic loss term $\mu"$ (complex permeability characteristics) for a frequency f in the sample 4 (the second comparison sample), but it was shown that the sample 4 had an extremely high resistance due to a high rate of an oxide layer, while magnetic interaction between magnetic particles was extremely little due to few magnetic layer. As a result, superparamagnetism was exhibited and the characteristics of the magnetic loss term could not be observed.

According to these results, it is noted that the magnetic substance of a granular magnetic thin film in samples 1 and 2 has extremely high magnetic loss characteristics in a narrow band only in a high frequency range, and is extremely effective as a high frequency current suppressor.

Sample 5

Here, Ar+$N_2$ gas was supplied into the vacuum container 61 from the gas supplying apparatus 57, and the vacuum pump 59 maintained the vacuum degree in the vacuum container 61 to be around $1.33 \times 10^{-4}$ Pa. In such Ar+$N_2$ gas atmosphere, total 120 pieces of Al chips with the dimensions of 5 mm in height×5 mm in width×2 mm in thickness, which would be chips 67, were disposed on an Fe-made round plate having a diameter φ of 100 mm, which would be the target 69, and a high frequency power was supplied from the high frequency power source 71. Under this condition, a magnetic thin film was formed on a glass plate, which would be the substrate 65, by a responsive sputtering method, and then, the formed magnetic thin film was heat-treated at a temperature of 300° C. for two hours in vacuum under magnetic field so as to obtain a sample 5 of a granular magnetic thin film, which is different from the above-described granular magnetic thin film in composition.

This sample 5 was examined in dimension and magnetic characteristics. The sample had 1.5 μm in film thickness and 51.9% in percent ratio $\{M_S (M-X—Y)/M_S (M)\} \times 100\%$. The maximum value $\mu''_{max}$ of the magnetic loss term $\mu''$ was 520, the frequency f $(\mu''_{max})$ at the maximum value $\mu''_{max}$=520 was 830 MHz, and the relative bandwidth bwr was 175%.

Sample 6

Here, Ar gas was supplied into the vacuum container 61 from the gas supplying apparatus 57, and the vacuum pump 59 maintained the vacuum degree in the vacuum container 61 to be around $1.33 \times 10^{-4}$ Pa. In such Ar atmosphere, total 130 pieces of $Al_2O_3$ chips with the dimensions of 5 mm in height×5 mm in width×2 mm in thickness, which would be chips 67, were disposed on an Fe-made round plate having a diameter φ of 100 mm, which would be the target 69, and a high frequency power was supplied from the high frequency power source 71. Under this condition, a magnetic thin film was formed on a glass plate, which would be the substrate 65, by a sputtering method, and then, the formed magnetic thin film was heat-treated at a temperature of 300° C. for two hours in vacuum under magnetic field so as to obtain a sample 6 of a granular magnetic thin film.

This sample 6 was examined in dimension and magnetic characteristics. The sample had 1.1 μm in film thickness and 64.7% in percent ratio $\{M_S (M-X—Y)/M_S (M)\} \times 100\%$. The maximum value $\mu''_{max}$ of the magnetic loss term $\mu''$ was 850, the frequency f $(\mu''_{max})$ at the maximum value $\mu''_{max}$=850 was 800 MHz, and the relative bandwidth bwr was 157%.

Sample 7

Here, Ar+$N_2$ gas with 10% of $N_2$ divided voltage was supplied into the vacuum container 61 from the gas supplying apparatus 57, and the vacuum pump 59 maintained the vacuum degree in the vacuum container 61 to be around $1.33 \times 10^{-4}$ Pa. In such Ar+$N_2$ gas atmosphere, total 170 pieces of Al chips with the dimensions of 5 mm in height×5 mm in width×2 mm in thickness, which would be chips 67, were disposed on a Co-made round plate having a diameter φ of 100 mm, which would be the target 69, and a high frequency power was supplied from the high frequency power source 71. Under this condition, a magnetic thin film was formed on a glass plate, which would be the substrate 65, by a responsive sputtering method, and then, the formed magnetic thin film was heat-treated at a temperature of 300° C. for two hours in vacuum under magnetic field so as to obtain a sample 7 of a granular magnetic thin film.

This sample 7 was examined in dimension and magnetic characteristics. The sample had 1.2 μm in film thickness and 37.2% in percent ratio $\{M_S (M-X—Y)/M_S (M)\} \times 100\%$. The maximum value $\mu''_{max}$ of the magnetic loss term $\mu''$ was 350, the frequency f $(\mu''_{max})$ at the maximum value $\mu''_{max}$×350 was 1 GHz, and the relative bandwidth bwr was 191%.

Sample 8

Here, Ar gas was supplied into the vacuum container 61 from the gas supplying apparatus 57, and the vacuum pump 59 maintained the vacuum degree in the vacuum container 61 to be around $1.33 \times 10^{-4}$ Pa. In such Ar gas atmosphere, total 140 pieces of $Al_2O_3$ chips with the dimensions of 5 mm in height×5 mm in width×2 mm in thickness, which would be chips 67, were disposed on an Ni-made round plate having a diameter φ of 100 mm, which would be the target 69, and a high frequency power was supplied from the high frequency power source 71. Under this condition, a magnetic thin film was formed on a glass plate, which would be the substrate 65, by a sputtering method, and then, the formed magnetic thin film was heat-treated at a temperature of 300° C. for two hours in vacuum under magnetic field so as to obtain a sample 8 of a granular magnetic thin film.

This sample 8 was examined in dimension and magnetic characteristics. The sample had 1.7 μm in film thickness and 58.2% in percent ratio $\{M_S (M-X—Y)/M_S (M)\} \times 100\%$. The maximum value $\mu''_{max}$ of the magnetic loss term $\mu''$ was 280, the frequency f $(\mu''_{max})$ at the maximum value $\mu''_{max}$=280 was 240 MHz, and the relative bandwidth bwr was 169%.

Sample 9

Here, Ar+$N_2$ gas with 10% of $N_2$ divided voltage was supplied into the vacuum container 61 from the gas supplying apparatus 57, and the vacuum pump 59 maintained the vacuum degree in the vacuum container 61 to be around $1.33 \times 10^{-4}$ Pa. In such Ar+$N_2$ gas atmosphere, total 100 pieces of Al chips with the dimensions of 5 mm in height×5 mm in width×2 mm in thickness, which would be chips 67, were disposed on an Ni-made round plate having a diameter φ of 100 mm, which would be the target 69, and a high frequency power was supplied from the high frequency power source 71. Under this condition, a magnetic thin film was formed on a glass plate, which would be the substrate 65, by a responsive sputtering method, and then, the formed magnetic thin film was heat-treated at a temperature of 300° C. for two hours in vacuum under magnetic field so as to obtain a sample 9 of a granular magnetic thin film.

This sample 9 was examined in dimension and magnetic characteristics. The sample had 1.3 μm in film thickness and 76.2% in percent ratio $\{M_S (M-X—Y)/M_S (M)\} \times 100\%$. The maximum value $\mu''_{max}$ of the magnetic loss term $\mu''$ was 410, the frequency f $(\mu''_{max})$ at the maximum value $\mu''_{max}$=410 was 170 MHz, and the relative bandwidth bwr was 158%.

Sample 10

Here, Ar gas was supplied into the vacuum container 61 from the gas supplying apparatus 57, and the vacuum pump 59 maintained the vacuum degree in the vacuum container 61 to be around $1.33 \times 10^{-4}$ Pa. In such Ar gas atmosphere, total 150 pieces of $TiO_3$ chips with the dimensions of 5 mm in height×5 mm in width×2 mm in thickness, which would be chips 67, were disposed on an Fe-made round plate having a diameter φ of 100 mm, which would be the target 69, and a high frequency power was supplied from the high frequency power source 71. Under this condition, a magnetic thin film was formed on a glass plate, which would be the substrate 65, by a sputtering method, and then, the formed magnetic thin film was heat-treated at a temperature of 300° C. for two hours in vacuum under magnetic field so as to obtain a sample 10 of a granular magnetic thin film described above.

This sample 10 was examined in dimension and magnetic characteristics. The sample had 1.4 μm in film thickness and 43.6% in percent ratio $\{M_S(M\text{-}X\text{—}Y)/M_S(M)\}\times 100\%$. The maximum value $\mu''_{max}$ of the magnetic loss term $\mu''$ was 920, the frequency f ($\mu''_{max}$) at the maximum value $\mu''_{max}$=920 was 1.5 GHz, and the relative bandwidth bwr was 188%.

Sample 11

Here, Ar+$O_2$ gas with 15% Of $O_2$ divided voltage was supplied into the vacuum container 61 from the gas supplying apparatus 57, and the vacuum pump 59 maintained the vacuum degree in the vacuum container 61 to be around $1.33\times 10^{-4}$ Pa. In such Ar+$O_2$ gas atmosphere, total 130 pieces of Si chips with the dimensions of 5 mm in height×5 mm in width×2 mm in thickness, which would be chips 67, were disposed on an Fe-made round plate having a diameter φ of 100 mm, which would be the target 69, and a high frequency power was supplied from the high frequency power source 71. Under this condition, a magnetic thin film was formed on a glass plate, which would be the substrate 65, by a responsive sputtering method, and then, the formed magnetic thin film was heat-treated at a temperature of 300° C. for two hours in vacuum under magnetic field so as to obtain a sample 11 of a granular magnetic thin film.

This sample 11 was examined in dimension and magnetic characteristics. The sample had 1.5 μm in film thickness and 55.2% in percent ratio $\{M_S(M\text{-}X\text{—}Y)/M_S(M)\}\times 100\%$. The maximum value $\mu''_{max}$ of the magnetic loss term $\mu''$ was 920, the frequency f ($\mu''_{max}$) at the maximum value $\mu''_{max}$=920 was 1.2 GHz, and the relative bandwidth bwr was 182%.

Sample 12

Here, Ar gas was supplied into the vacuum container 61 from the gas supplying apparatus 57, and the vacuum pump 59 maintained the vacuum degree in the vacuum container 61 to be around $1.33\times 10^{-4}$ Pa. In such Ar gas atmosphere, total 100 pieces of $HfO_3$ chips with the dimensions of 5 mm in height×5 mm in width×2 mm in thickness, which would be chips 67, were disposed on an Fe-made round plate having a diameter φ of 100 mm, which would be the target 69, and a high frequency power was supplied from the high frequency power source 71. Under this condition, a magnetic thin film was formed on a glass plate, which would be the substrate 65, by a sputtering method, and then, the formed magnetic thin film was heat-treated at a temperature of 300° C. for two hours in vacuum under magnetic field so as to obtain a sample 12 of a granular magnetic thin film described above.

This sample 12 was examined in dimension and magnetic characteristics. The sample had 1.8 μm in film thickness and 77.4% in percent ratio $\{M_S(M\text{-}X\text{—}Y)/M_S(M)\}\times 100\%$. The maximum value $\mu''_{max}$ of the magnetic loss term $\mu''$ was 1800, the frequency f ($\mu''_{max}$) at the maximum value $\mu''_{max}$=1800 was 450 MHz, and the relative bandwidth bwr was 171%.

Sample 13

Here, Ar gas was supplied into the vacuum container 61 from the gas supplying apparatus 57, and the vacuum pump 59 maintained the vacuum degree in the vacuum container 61 to be around $1.33\times 10^{-4}$ Pa. In such Ar gas atmosphere, total 130 pieces of BN chips with the dimensions of 5 mm in height×5 mm in width×2 mm in thickness, which would be chips 67, were disposed on an Fe-made round plate having a diameter φ of 100 mm, which would be the target 69, and a high frequency power was supplied from the high frequency power source 71. Under this condition, a magnetic thin film was formed on a glass plate, which would be the substrate 65, by a sputtering method, and then, the formed magnetic thin film was heat-treated at a temperature of 300° C. for two hours in vacuum under magnetic field so as to obtain a sample 13 of a granular magnetic thin film described above.

This sample 13 was examined in dimension and magnetic characteristics. The sample had 1.9 μm in film thickness and 59.3% in percent ratio $\{M_S(M\text{-}X\text{—}Y)/M_S(M)\}\times 100\%$. The maximum value $\mu''_{max}$ of the magnetic loss term $\mu''$ was 950, the frequency f ($\mu''_{max}$) at the maximum value $\mu''_{max}$=950 was 680 MHz, and the relative bandwidth bwr was 185%.

Sample 14

Here, Ar gas was supplied into the vacuum container 61 from the gas supplying apparatus 57, and the vacuum pump 59 maintained the vacuum degree in the vacuum container 61 to be around $1.33\times 10^{-4}$ Pa. In such Ar gas atmosphere, total 130 pieces of $Al_2O_3$ chips with the dimensions of 5 mm in height×5 mm in width×2 mm in thickness, which would be chips 67, were disposed on an $Fe_{50}Co_{50}$-made round plate having a diameter φ of 100 mm, which would be the target 69, and a high frequency power was supplied from the high frequency power source 71. Under this condition, a magnetic thin film was formed on a glass plate, which would be the substrate 65, by a sputtering method, and then, the formed magnetic thin film was heat-treated at a temperature of 300° C. for two hours in vacuum under magnetic field so as to obtain a sample 14 of a granular magnetic thin film described above.

This sample 14 was examined in dimension and magnetic characteristics. The sample had 1.6 μm in film thickness and 59.3% in percent ratio $\{M_S(M\text{-}X\text{—}Y)/M_S(M)\}\times 100\%$. The maximum value $\mu''_{max}$ of the magnetic loss term $\mu''$ was 720, the frequency f ($\mu''_{max}$) at the maximum value $\mu''_{max}$=720 was 1.1 GHz, and the relative bandwidth bwr was 180%.

Figure 8B:
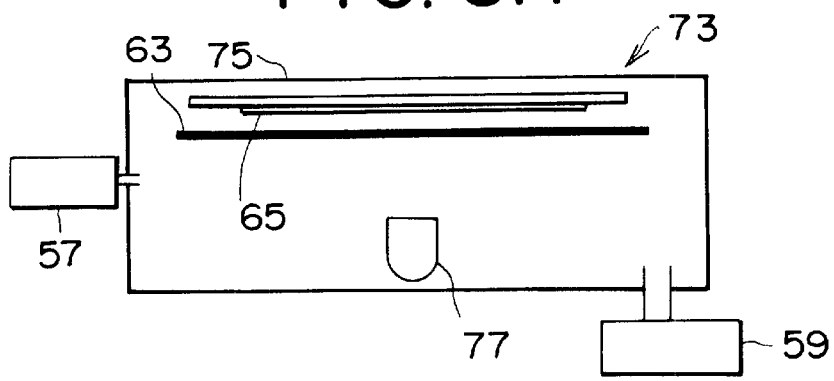
FIG. 8B shows a sample producer of a vacuum evaporating method applying type.

Next, a process for manufacturing a granular magnetic loss material as samples by a vapor deposition method will be concretely described. In producing each sample, however, a sample producing apparatus of a vapor deposition method adopting type is used, as shown in FIG. 8B. This sample producing apparatus of a vapor deposition method adopting type comprises a vacuum container (chamber) 75, to which a gas supplying apparatus 57 and a vacuum pump 59 are connected and in which a substrate 65 is faced to a crucible 28 charged with an alloy parent material having the components X—Y with a shutter 63 disposed between the substrate 65 and the target 69.

Sample 15

Here, oxygen was supplied at a rate of flow of 3.0 sccm into the vacuum container 75 from the gas supplying apparatus 57, and the vacuum pump 59 maintained the vacuum degree in the vacuum container 75 to be around $1.33\times 10^{-4}$ Pa. Then, under a condition that the $Fe_{70}Al_{30}$ alloy parent material charged in the crucible 77 melts to be exposed to the oxygen, a magnetic thin film was formed on a glass plate, which would be the substrate 65, by a vapor deposition method, and then, the formed magnetic thin film was heat-treated at a temperature of 300° C. for two hours in vacuum under magnetic field so as to obtain a sample 15 of a granular magnetic thin film described above.

This sample 15 was examined in dimension and magnetic characteristics. The sample had 1.1 $\mu$m in film thickness and 41.8% in percent ratio $\{M_S(M-X-Y)/M_S(M)\} \times 100\%$. The maximum value $\mu''_{max}$ of the magnetic loss term $\mu''$ was 590, the frequency f ($\mu''_{max}$) at the maximum value $\mu''_{max}$=590 was 520 MHz, and the relative bandwidth bwr was 190%.

All of the above-described samples 1 to 15 other than the comparison samples 3 and 4 are effective as a material to be used in an electronic component as a countermeasure against a high frequency current. The respective samples 1 to 15 were produced by a sputtering method or a vapor deposition method in the above example, but another forming method such as an ion beam deposition and a gas deposition can be adopted. The forming method is not limited as far as the magnetic loss material can be evenly produced. Further, it was described that the respective samples 1 to 15 were obtained by heat-treatment in vacuum under magnetic field after forming a film, but a treatment after forming a film is not limited to what is described, as far as the composition or the film-forming method is capable of obtaining an equivalent function with a film of AS-deposition.

As an example of the samples 1 to 15, in the sample 1 having complex permeability characteristics shown in FIG. 9, having 2.0 $\mu$m in film thickness, and forming a square with 20 mm of each side (the sample having the relative bandwidth bwr of 148%), the maximum value $\mu''_{max}$ of the magnetic loss term $\mu''$ was about 1800 at about 700 MHz. On the other hand, in the comparison sample (having the relative bandwidth bwr of 196%) of a composite magnetic substance sheet, which has the same area and the same shape as the above sample 1 and which is made of a flat form of sendust powder and a polymer prepared for a comparison sample relating to another prior art, the maximum value $\mu''_{max}$ of the magnetic loss term $\mu''$ was about 3.0 at about 700 MHz.

As a result of the above, it is noted that the magnetic loss term $\mu''$ of the sample 1 has a distribution in a sub-microwave band, its maximum value $\mu''_{max}$ is around 1800 at about 700 MHz, which is about 600 times as large as the maximum value $\mu''_{max}$ in the comparison sample having a distribution of the magnetic loss term $\mu''$ in the same bandwidth, the ratio of the relative bandwidth bwr to the center frequency is lower than that of the comparison sample, and the bandwidth is narrow.

Figure 12:
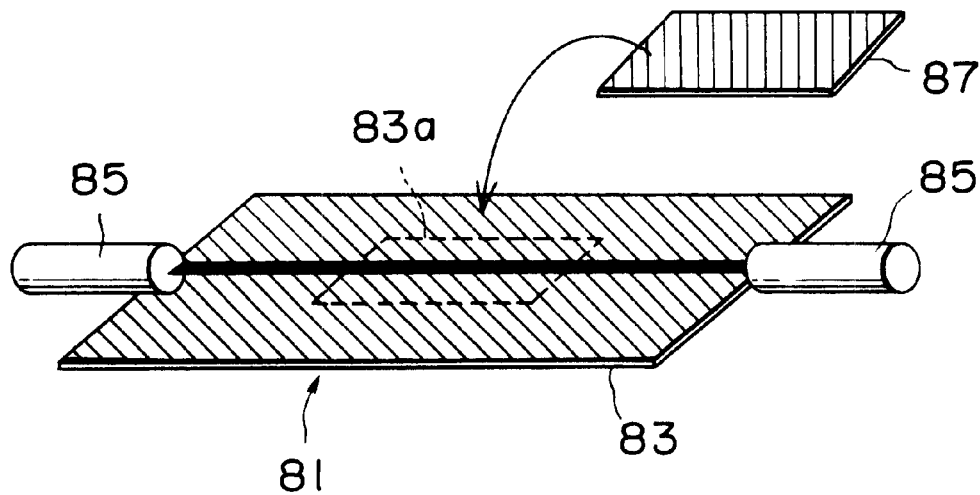
FIG. 12 is a perspective view of a basic structure of a high frequency current suppression effect measuring apparatus for measuring a high frequency current suppression effect of each sample produced by means of the sample producer of a sputtering method applying type shown in FIG. 8A and by means of the sample producer of a vacuum evaporating method applying type shown in FIG. 8B.

Moreover, the effect in high frequency current suppression of the sample 1 and the comparison sample (composite magnetic substance sheet) were examined for verification by means of a high frequency current suppression effect measuring apparatus 81 shown in FIG. 12. In the high frequency current suppression effect measuring apparatus 81, a co-axial line 32 for connecting a micro-strip line 31 and a network analyzer (HP8753D) not shown is disposed at the both ends of the micro-strip line 31, which has a line length of 75 mm and characteristic impedance Zc of 50 $\Omega$, in its longitudinal direction, and a magnetic substance sample 33 is disposed just over a sample disposing portion 31a of the micro-strip line 31, so that a transmitting character (permeability character) can be measured between two ports.

When a magnetic loss material is disposed adjacent to a transmission path, as shown in a structure of the above high frequency current suppression effect measuring apparatus 30, so that the transmission path can get an equivalent resistance component for the purpose of high frequency current suppression, the high frequency current suppression effect appears to be generally in proportion to a product $\mu''\cdot\delta$ of the magnetic loss term $\mu''$ and a thickness $\delta$ of the magnetic substance. Therefore, upon comparing the sample 1 with the comparison sample (composite magnetic sheet) in suppression effect, the magnetic loss term $\mu''$ is set at about 3 and the thickness $\delta$ of the magnetic substance is set at 1.0 mm in the comparison sample so that the value of the product $\mu''$ would be the same order.

Figure 13A:
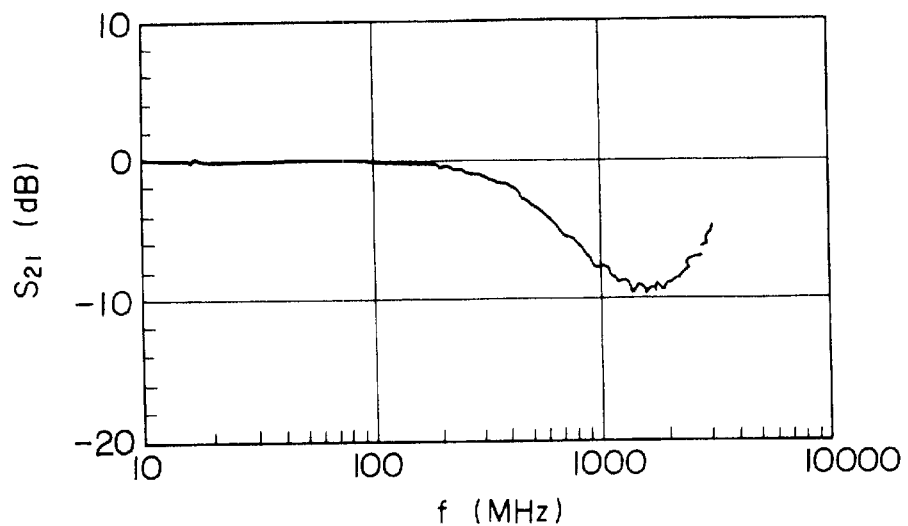
FIG. 13A shows transmission characteristics of the sample 1 for a frequency, which is a result of measuring the high frequency current suppression effect of a sample magnetic substance by means of a high frequency current suppression effect measuring apparatus shown in FIG. 12.
Figure 13B:
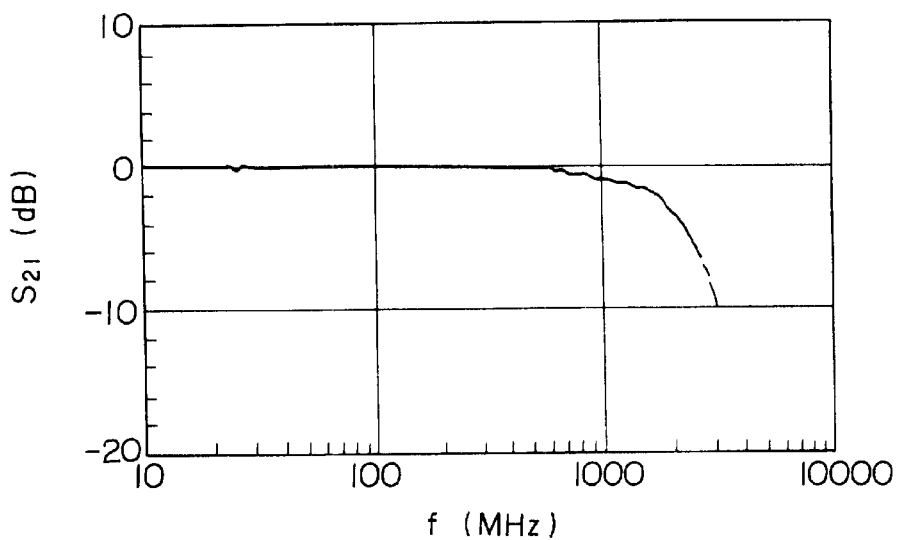
FIG. 13B shows transmission characteristics for a frequency, which is a result of measuring the high frequency current suppression effect of a conventional comparison sample, i.e. composite magnetic substance sheet.

Referring to FIGS. 13A and 13B, the transmission $S_{21}$ characteristics of the sample 1 decrease from 100 MHz or more and increases after pointing at the minimum value of −10 dB near 2 GHz, while the transmission $S_{21}$ characteristics of the comparison sample decrease monotonically from a few hundreds MHz and points at about −10 dB at 3 GHz. According to these results, it is noted that either transmission $S_{21}$ characteristics depend on a distribution of the magnetic loss term $\mu''$ of a magnetic substance, and that the suppression effect depends on the above-mentioned product $\mu''\cdot\delta$.

Figure 14:
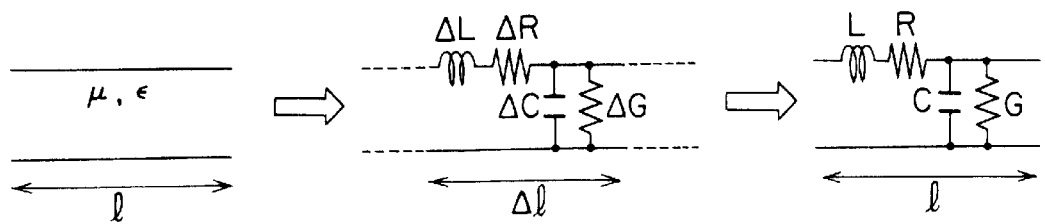
FIG. 14 is a simplified diagram showing transmission characteristics, as an equivalent circuit, of a magnetic substance including the sample 1 shown in FIG. 13A and the comparison sample shown in FIG. 13B.

A magnetic substance such as the sample 1 and the comparison sample has an inductance $\Delta L$ and resistance $\Delta R$ in the form of series connection as an equivalent circuit constant per a unit length ($\Delta l$), electrostatic capacity $\Delta C$ interposed between the above and the grounding conductor, and conductance $\Delta G$ (reciprocal of the resistance $\Delta R$), when it is considered that a magnetic substance such as the sample 1 and the comparison sample is arranged to have 1 in dimension and to be a distributed constant line of the permeability $\mu$ and dielectric constant $\epsilon$, as shown in FIG. 14. They are arranged as an equivalent circuit having an inductance L, resistance R, electrostatic capacity C, and conductance G (reciprocal of the resistance R) as an equivalent circuit constant in the case of converting into the sample dimension I on the transmission $S_{21}$ characteristics.

When a magnetic substance is disposed on the micro-strip line 83 like the examination of high frequency current suppression effect here, a change of the transmission $S_{21}$ characteristics depends on a component of the resistance R mainly added in series to the inductance L in an equivalent circuit. Thus, the frequency dependence can be examined by seeking the resistance R.

Figure 15A:
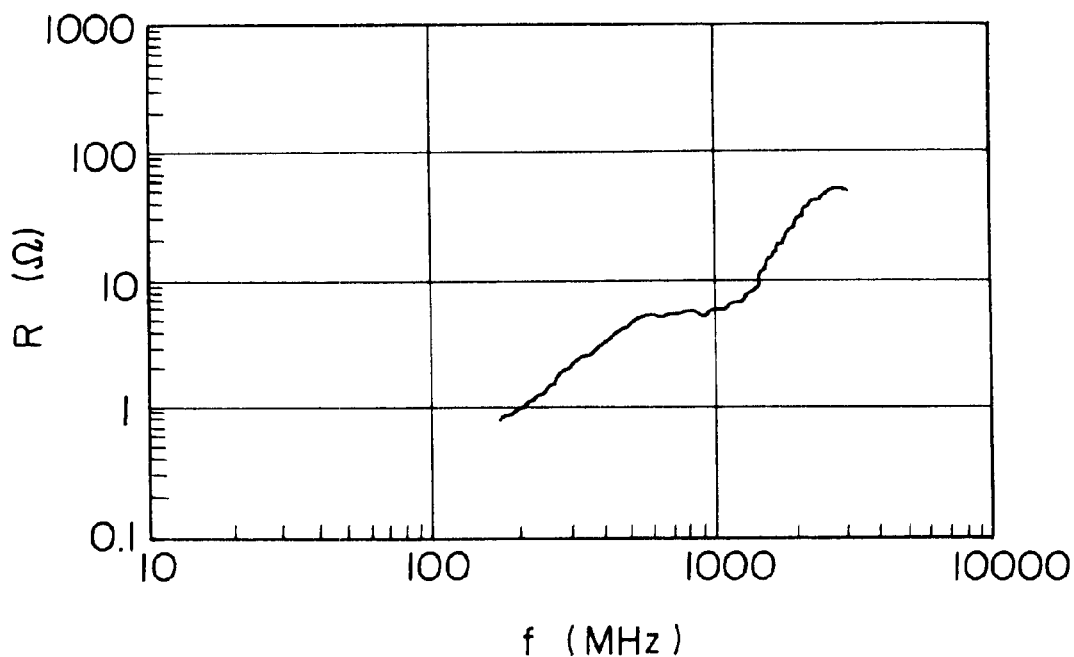
FIG. 15A shows resistance characteristics of the sample 1 for a frequency calculated in accordance with a resistance added in series to an inductance of the equivalent circuit shown in FIG. 14 in the transmission characteristics shown in FIG. 13.
Figure 15B:
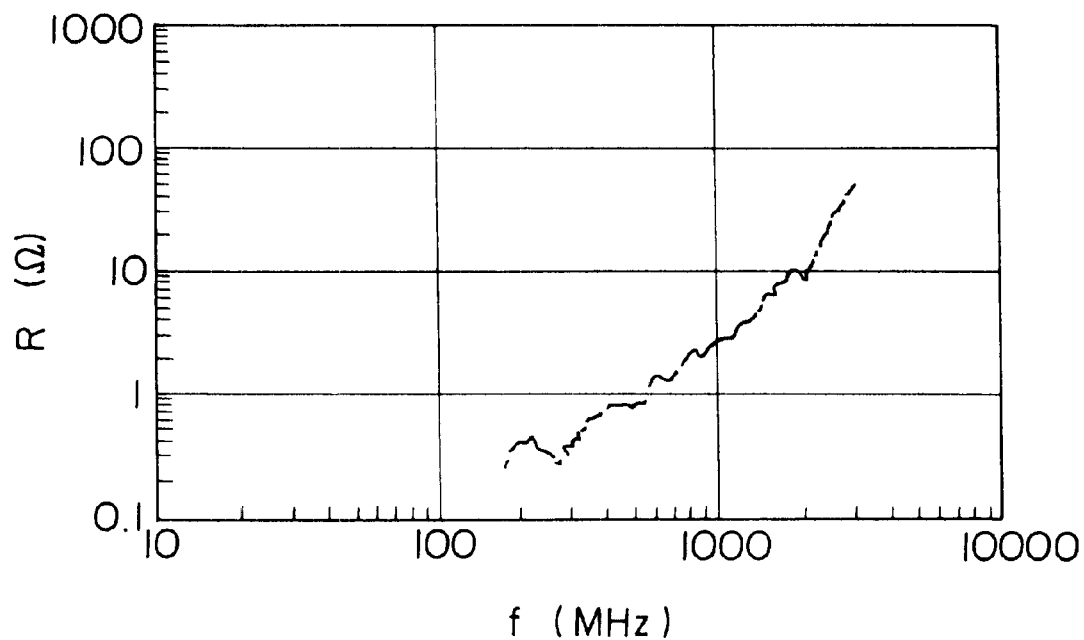
FIG. 15B shows resistance characteristics of the comparison sample, i.e. composite magnetic substance sheet, in the prior art.

Referring to FIGS. 15A and 15B, it is noted that in resistance R ($\Omega$) characteristics to the frequency f calculated on the basis of a value of the resistance R added in series to the inductance L in an equivalent circuit shown in FIG. 14 in the transmission $S_{21}$ characteristics shown in FIG. 13, the resistance R of the sample 1 and the comparison sample increases monotonically in a sub-microwave band in either case, and points at a few tens $\Omega$ at 3 GHz. The frequency dependence has a different inclination from the frequency distribution of the magnetic loss term $\mu''$, which has the peak near 1 GHz, in either case. This can be considered to be a result of response to that the ratio of the sample dimension to the wavelength increases monotonically in addition to the above-mentioned product $\mu''\cdot\delta$.

According to the above results, the sample having a distribution of the magnetic loss term $\mu''$ in the sub-microwave band has the high frequency current suppression effect equivalent to the comparison sample (composite magnetic substance sheet), which is about 500 times as thick as the above sample. Therefore, it can be judged to be effective to apply it as a countermeasure against a high frequency current in an electronic component such as the semiconductor active device operating at a high clock close to 1 GHz.

As described above, in an electronic component of the high frequency current suppression type according to the invention, a high frequency current suppressor for attenuating a high frequency current, which passes through a predetermined number of terminals themselves, is disposed on a part or all of the terminals provided on the electronic component, otherwise, a part or all of the predetermined number of terminals themselves are formed into a similar high frequency current suppressor. Thus, the high frequency current suppressor can completely attenuates a high frequency current even when the electronic component is used at a high frequency in a bandwidth from a few tens MHz to a few GHz, so that an electromagnetic interference is prevented from occurring and its bad influence can be deleted. Therefore, a high frequency current suppression countermeasure (electromagnetic interference countermeasure) can be effectively planned, when a high frequency current suppressor is especially disposed on terminals of a logic circuit device, which is a semiconductor active device having a further inclination of high-speed operation with a high frequency as an electronic component in future, and which is represented by a semiconductor integrated circuit device (IC) or a semiconductor large-scale integrated circuit device (LSI), which cannot avoid a high integration and a high density in mounting, a microprocessor (MPU), a central processing unit (CPU), an image processor arithmetic logic unit (IPALU) or such.

In a bonding wire of a high frequency current suppression type for an electronic component according to the invention, the bonding wire itself is arranged to have a structure of a high frequency current suppression type, which has a high frequency current suppressor, which is disposed on a surface of a conductor, for attenuating a high frequency current passing through the conductor itself in a bandwidth from a few tens MHz to a few GHz, a bare chip comprising inner connection terminals provided to a main body for processing a signal is built in, and it is possible to apply the bonding wire to an electronic component having a structure that a bonding wire of a high frequency current suppression type connects each inner connection terminal with each outside connection terminal separately provided in the main body for transmitting a signal. Thus, the high frequency current suppressor can completely attenuates a high frequency current when the high frequency current passing through each outside connection terminal is transmitted to the bonding wire in using an electronic component at a high frequency in a bandwidth from a few tens MHz to a few GHz, so that the high frequency current can be prevented from being transmitted to each inner connection terminal of the bare chip. As a result, an electromagnetic interference can be prevented from occurring and its bad influence (such as an error operation of the semiconductor integrated circuit device 31) can be deleted. Therefore, a high frequency current suppression countermeasure (electromagnetic interference countermeasure) can be effectively planned, when such bonding wire of a high frequency current suppression type is especially applied for connection for the purpose of constructing a logic circuit device, which is a semiconductor active device having a further inclination of high-speed operation at a high frequency as an electronic component in future, and which is represented by a semiconductor integrated circuit device (IC) or a semiconductor large-scale integrated circuit device (LSI), which cannot avoid a high integration and a high density in mounting, a microprocessor (MPU), a central processing unit (CPU), an image processor arithmetic logic unit (IPALU) or such.

What is claimed is:

1. A bonding wire of high frequency current suppression type for an electronic component, comprising a conductor for connecting electronic components and predetermined places, said conductor has a high frequency current suppressor formed on at least a part of a surface of the conductor, said high frequency current suppressor attenuating a high frequency current passing through the above conductor itself in a bandwidth from a few tens MHZ and a few GHz, and being a magnetic loss material in a M-X—Y system, the magnetic loss material being made of a compound of composition elements M, Y and X, wherein M donates at least one of Fe, Co and Ni, Y donates at least one of F, N and O, and X donates at least one of elements other than that of included in M and Y, said composition element M existing in the form of granularity distributed in a matrix of a compound of the composition element X and a composition element Y.

2. The bonding wire of a high frequency current suppression type for an electronic component according to claim 1, wherein said high frequency current suppressor is formed in a manner such that at least a connecting portion at both ends of the conductor would be exposed.

3. The bonding wire of a high frequency current suppression type for an electronic component according to claim 2, wherein the high frequency current suppressor is formed in a lattice shape and also in a manner such that a connecting portion at the both ends of said conductor would be exposed.

4. The bonding wire of a high frequency current suppression type for an electronic component according to claim 2, wherein the high frequency current suppressor is formed in a spiral shape and also in a manner such that a connecting portion at the both ends of said conductor would be exposed.

5. The bonding wire of a high frequency current suppression type for an electronic component according to claim 1, wherein said high frequency current suppressor is formed on a surface of the conductor in advance in a manufacturing process of making said conductor.

6. The bonding wire of a high frequency current suppression type for an electronic component according to claim 5, wherein said high frequency current suppression is formed on a surface of the conductor by a sputtering method.

7. The bonding wire of a high frequency current suppression type for an electronic component according to claim 5, wherein said high frequency current suppressor is formed on a surface of the conductor by a vapor deposited method.

8. The bonding wire of a high frequency current suppression type for an electronic component according to claim 1, wherein said electronic component has a bare chip to be built in, which comprises a predetermined number of inner connection terminal provided in a main body for processing a signal, and is provided for respectively connecting the predetermined number of inner connection terminals with a predetermined number of outer connection terminal separately provided in said main body for transmitting a signal.

9. The bonding wire of a high frequency current suppression type for an electronic component according to claim 1, wherein said high frequency current suppressor is in a range from 0.3 to 20 ($\mu$m) in thickness.

10. The bonding wire of a high frequency current suppression type for an electronic component according to claim 1, wherein the high frequency current suppressor is a thin film magnetic substance.

11. The bonding wire of a high frequency current suppression type for an electronic component according to claim 1, wherein said high frequency current suppressor is made of a narrow bandwidth magnetic loss material such that the maximum value $\mu''_{max}$ of an imaginary part $\mu''$ exists in a frequency range of 100 MHz to 10 GHz in complex permeability characteristics and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

12. The bonding wire of a high frequency current suppression type for an electronic component according to claim 11, wherein a saturation magnetization of said narrow band magnetic loss material is in a range from 80 to 60 (%) of that of a metallic magnetic substance comprising the composition element M alone.

13. The bonding wire of a high frequency current suppression type for an electronic component according to claim 11, wherein said narrow band magnetic loss material has a direct current resistivity in a range from 100 to 700 ($\mu\Omega\cdot$cm).

14. The bonding wire of a high frequency current suppression type for an electronic component according to claim 11, wherein said narrow bandwidth magnetic loss material or said broad bandwidth magnetic loss material has the compostion element X, which is at leat one of C, B, Si, Al, Mg, Ti, Zn, Hf, Sr, Nb, Ta and rare earth elements.

15. The bonding wire of a high frequency current suppression type for an electronic component according to claim 1, wherein said high frequency current suppression is made of a board bandwidth magnetic loss material such that the maximum value m" max of an imaginary part m" exists in a frequency range of 100 MHz to 10 GHz in complex permeadbility characteristics and that a relative bandwidth bwr is not smaller than 150% where the relative bandwidth bwr is obtained by extracting a frequency bandwidth between two frequencies at which the value of $\mu''$ is 50% of the maximum $\mu''$ max and normalizing the frequency bandwidth at the center frequency thereof.

16. The bonding wire of a high frequency current suppression type for an electronic component according to claim 15, wherein a saturation magnetization of said broad bandwidth magnetic loss material is in a range from 60 to 35(%) of that of a magnetic substance comprising the composition element M alone.

17. The bonding wire of a high frequency current suppression type for an electronic component according to claim 15, wherein said broad bandwidth magnetic loss material has a direct current resistivity more than 500 ($\mu\Omega\cdot$cm).

18. The bonding wire of a high frequency current suppression type for an electronic component according to claim 1, wherein said magnetic loss material has an average particle diameter of a particle, which exists in the form of granularity, in a range from 1 to 40 (nm).

19. The bonding wire of a high frequency current suppression type for an electronic component according to claim 1, wherein said magnetic loss material has an anisotropy magnetic field of 47400 A/m or less.

20. The bonding wire of a high frequency current suppression type for an electronic component according to claim 1, wherein said M-X—Y (system is an Fe—Al—O system.

21. The bonding wire of a high frequency current suppression type for an electronic component according to claim 1, wherein said M-X—Y system is an Fe—Si—O system.

22. The bonding wire of a high frequency current suppression type for an electronic component according to claim 1, wherein said electronic component is a semiconductor active device operating at a high speed in using at a high frequency band, and also is one of a semiconductor integrated circuit device, a semiconductor large-scale integrated circuit device, and a logic circuit device.

23. A bonding wire of high frequency current suppression type for an electronic component, comprising a conductor for connecting electronic components and predetermined places, wherein a high frequency current suppressor for attenuating a high frequency current passing through the above conductor itself in a bandwidth from a few tens MHz and a few GHz, is formed on at least a part of a surface of the conductor, the high frequency current suppressor being (i) formed in a manner such that at least a connecting portion at both ends of the conductor would be exposed, and (ii) formed in a shape selected from the group consisting of a lattice shape and a spiral shape.

* * * * *